(12) United States Patent
Abraham et al.

(10) Patent No.: US 8,269,931 B2
(45) Date of Patent: Sep. 18, 2012

(54) SYSTEMS AND METHODS FOR PREPARING FILMS USING SEQUENTIAL ION IMPLANTATION, AND FILMS FORMED USING SAME

(75) Inventors: Margaret H. Abraham, Portola Valley, CA (US); David P. Taylor, Hawthorne, CA (US)

(73) Assignee: The Aerospace Corporation, El Segundo, CA (US)

( * ) Notice: Subject to any disclaimer, the term of this patent is extended or adjusted under 35 U.S.C. 154(b) by 282 days.

(21) Appl. No.: 12/584,939

(22) Filed: Sep. 14, 2009

(65) Prior Publication Data

US 2011/0064370 A1    Mar. 17, 2011

(51) Int. Cl.
*G02F 1/1333* (2006.01)
*G02F 1/1337* (2006.01)

(52) U.S. Cl. ............... 349/122; 349/123; 349/124

(58) Field of Classification Search ............ 349/122, 349/123, 124
See application file for complete search history.

(56) References Cited

U.S. PATENT DOCUMENTS

| | | | |
|---|---|---|---|
| 3,976,511 A | | 8/1976 | Johnson et al. |
| 4,677,740 A | * | 7/1987 | Shifrin et al. ............... 438/24 |
| 4,993,034 A | * | 2/1991 | Aoki et al. ............... 372/40 |
| 5,133,757 A | | 7/1992 | Sioshansi et al. |
| 5,725,573 A | | 3/1998 | Dearnaley et al. |
| 5,822,347 A | * | 10/1998 | Yokogawa et al. ........ 372/45.01 |
| 5,953,603 A | | 9/1999 | Kim |
| 6,472,109 B2 | | 10/2002 | Rolfson |
| 6,590,271 B2 | | 7/2003 | Liu et al. |
| 6,709,961 B2 | | 3/2004 | Noda |
| 6,753,240 B2 | | 6/2004 | Hayashida |
| 6,815,301 B2 | | 11/2004 | Shindo |
| 6,833,313 B2 | | 12/2004 | Hayakawa |
| 7,005,340 B2 | | 2/2006 | Hayashi |
| 7,012,274 B2 | * | 3/2006 | Taylor ............................ 257/12 |
| 7,056,816 B2 | | 6/2006 | Shibata |

(Continued)

FOREIGN PATENT DOCUMENTS

CN        1123340 A        5/1996
(Continued)

OTHER PUBLICATIONS

Borders et al., "Formation of SiC in Silicon by Ion Implantation," Applied Physics Letters, vol. 18, No. 11, pp. 509-511 (Jun. 1, 1971).

(Continued)

*Primary Examiner* — K. Cyrus Kianni
(74) *Attorney, Agent, or Firm* — Jones Day; Nicola A. Pisano; Jaime D. Choi

(57) ABSTRACT

Systems and methods for preparing films using sequential ion implantation, and films formed using same, are provided herein. A structure prepared using ion implantation may include a substrate; an embedded structure having pre-selected characteristics; and a film within or adjacent to the embedded structure and including ions having a perturbed arrangement arising from the presence of the embedded structure. The perturbed arrangement may include the ions being covalently bonded to each other, to the embedded structure, or to the substrate, whereas the ions instead may be free to diffuse through the substrate in the absence of the embedded structure. The embedded structure may inhibit or impede the ions from diffusing through the substrate, such that the ions instead covalently bond to each other, to the embedded structure, or to the substrate. The film may include, for example, diamond-like carbon, graphene, or SiC having a pre-selected phase.

22 Claims, 14 Drawing Sheets

U.S. PATENT DOCUMENTS

| | | | |
|---|---|---|---|
| 7,170,083 | B2 | 1/2007 | Freeman et al. |
| 7,214,614 | B2 | 5/2007 | Chopra et al. |
| 7,419,915 | B2 * | 9/2008 | Abraham et al. ............ 438/743 |
| 7,419,917 | B2 | 9/2008 | Abraham |
| 7,510,786 | B2 | 3/2009 | Veerasamy et al. |
| 7,544,398 | B1 * | 6/2009 | Chang et al. ................ 427/537 |
| 7,799,589 | B2 * | 9/2010 | Akiyama et al. ............... 438/31 |
| 8,021,778 | B2 * | 9/2011 | Snyder et al. ................ 429/162 |
| 2002/0182827 | A1 * | 12/2002 | Abe et al. ..................... 438/455 |
| 2003/0082882 | A1 | 5/2003 | Babcock et al. |
| 2003/0082892 | A1 | 5/2003 | Fan et al. |
| 2004/0082149 | A1 * | 4/2004 | Sakaguchi et al. ........... 438/458 |
| 2005/0186759 | A1 * | 8/2005 | So ................................. 438/459 |
| 2005/0250289 | A1 | 11/2005 | Babcock et al. |
| 2006/0078024 | A1 * | 4/2006 | Matsumura et al. ....... 372/46.01 |
| 2006/0115965 | A1 | 6/2006 | Abraham |
| 2007/0217458 | A1 * | 9/2007 | Kitano et al. ............. 372/43.01 |
| 2008/0073643 | A1 * | 3/2008 | Ryu et al. ....................... 257/43 |
| 2008/0197362 | A1 * | 8/2008 | Hisamoto et al. .............. 257/86 |
| 2009/0032831 | A1 * | 2/2009 | Akiyama et al. ............... 257/98 |
| 2009/0072243 | A1 * | 3/2009 | Suda et al. ..................... 257/77 |
| 2009/0242935 | A1 * | 10/2009 | Fitzgerald .................... 257/187 |

FOREIGN PATENT DOCUMENTS

| | | |
|---|---|---|
| CN | 1348018 A | 5/2002 |
| DE | 19730296 | 1/1999 |
| EA | 1402 | 2/2001 |
| EP | 0363944 A | 4/1990 |
| ES | 2138884 | 1/2000 |
| GB | 2422246 A | 7/2006 |
| JP | 61-006319 A | 1/1986 |
| JP | 1-042564 A | 2/1989 |
| JP | 1-283824 A | 11/1989 |
| JP | 1-283825 A | 11/1989 |
| JP | 2-270974 A | 11/1990 |
| JP | 3-229854 A | 10/1991 |
| JP | 4-042920 A | 2/1992 |
| JP | 4-290429 A | 10/1992 |
| JP | 5-205616 | 8/1993 |
| JP | 6-056481 A | 3/1994 |
| JP | 6-132259 A | 5/1994 |
| JP | 8-274268 A | 10/1996 |
| JP | 2000-093503 | 4/2000 |
| JP | 2004-315876 A | 11/2004 |
| JP | 2006-000219 A | 1/2006 |
| JP | 2008-022696 A | 1/2008 |
| KR | 2004-0022639 | 3/2004 |
| WO | WO 98/26457 | 6/1998 |
| WO | WO 01/72104 A1 | 10/2001 |
| WO | WO 03/086496 A1 | 10/2003 |
| WO | WO 2005/043603 A2 | 5/2005 |

OTHER PUBLICATIONS

Friedland et al., "Dependence of critical damage energies in diamond on electronic stopping," Surface and Coatings Technology, vol. 158-159, pp. 64-68 (2002).

Harbsmeier et al., "Epitaxial regrowth of C- and N-implanted silicon and α-quartz," Nuclear Instruments and Methods in Physics Research B, vol. 136-138, pp. 263-267 (1998).

Martin et al., "High-temperature ion beam synthesis of cubic SiC," J.Appl. Phys., vol. 67, No. 6, pp. 2908-2912 (1990).

Moore et al., "Laser micromachining of thin films for optoelectronic devices and packages," Laser Micromachining for Optoelectronic Device Fabrication, Proceedings of SPIE, vol. 4941, pp. 140-147 (2003).

Serre et al., "β-SiC on $SiO_2$ formed by ion implantation and bonding for micromechanics applications," Sensors and Actuators, vol. 47, pp. 169-173 (1999).

Terakado et al. "Modification of surface condition and irradiation effects of synchrotron radiation on photoexcited etching of SiC," J. Vac. Sci. Technol. A, vol. 13, No. 6, pp. 2715-2720 (1995).

Vickridge et al., "Limiting step involved in the thermal growth of silicon oxide films on silicon carbide," Physical Review Letters, vol. 89, No. 25, pp. 256102-1 to 256102-4 (2002).

Wong et al., "Infrared absorption spectroscopy study of phase formation in SiC layers synthesized by carbon implantation into silicon with a metal vapor vacuum arc ion source," Nuclear Instruments and Methods in Physics Research B, vol. 140, pp. 70-74 (1998).

Belov et al., "Formation and 'White' Photoluminescence of Nanoclusters in SiOx Films Implanted with Carbon Ions," ISSN 1063-7826, Seminconductors, vol. 44, No. 11, pp. 1450-1456 (2010).

Huang et al., "Growth of nearly one nanometer large silicon particles in silicon carbide and their quantum-confined photoluminescence features," Nanotechnology, vol. 18, 445605, pp. 1-5 (2007).

Jambois et al., "White electroluminescence from C- and Si-rich thin silicon oxides," Applied Physics Letters, vol. 89, No. 25, pp. 253124-1 to 253124-3 (2006).

Jambois et al., "Field effect white and tunable electroluminescence from ion beam synthesized Si- and C-rich $SiO_2$ layers," Applied Physics Letters, vol. 91, No. 21, pp. 211105-1 to 211105-3 (2007).

Pellegrino et al., "Time-resolved analysis of the white photoluminescence from $SiO_2$ films after Si and C coimplantation," Applied Physics Letters, vol. 84, No. 1, pp. 25-27 (2004).

Perez-Rodriguez et al., "White luminescence from Si+ and C+ ion-implanted $SiO_2$ films," Journal of Applied Physics, vol. 94, No. 1, pp. 254-262 (2003).

Tetelbaum et al., "Effect of carbon implantation on visible luminescence and composition of Si-implanted $SiO_2$ layers," Surface and Coatings Technology 203, pp. 2658-2663 (2009).

Chandrasekhar et al., "Strategies for the synthesis of highly concentrated $Si_{1-y}C_y$ diamond-structured systems," Applied Physics Letters 72 (1998) 2117-2119.

Kantor et al., "Evolution of implanted carbon in silicon upon pulsed excimer laser annealing," Applied Physics Letters 69 (1996) 969-971.

Katharria et al., "Synthesis of buried SiC using an energetic ion beam," Journal of Physics D: Applied Physics 39 (2006) 3969-3973.

Krause et al., "Structure of silicon carbide precipitates in oxygen-implanted and annealed silicon-on-insulator material," Applied Physics Letters 53 (1988) 63-65.

Nguyen et al., "Spectroscopic ellipsometry studies of crystalline silicon implanted with carbon ions," Journal of Applied Physics 67 (1990) 3555-3559.

Taylor et al., "Carbon precipitation in silicon: Why is it so difficult?" Applied Physics Letters 62 (1993) 3336-3338.

Wong et al., "Cross-section transmission electron microscopy study of carbon-implanted layers in silicon," Applied Physics Letters 57 (1990) 798-800.

* cited by examiner

SYSTEMS AND METHODS FOR PREPARING FILMS USING SEQUENTIAL ION IMPLANTATION, AND FILMS FORMED USING SAME

FIELD

This application generally relates to preparing films using ion implantation, and films formed using ion implantation.

BACKGROUND

It is well known to prepare films by implanting ions into a substrate. The implanted ions change the physical and/or electronic properties of the substrate. For example, implanting ions of an electron acceptor, such as boron (B), or an electron donor, such as phosphorous (P), into a silicon (Si) substrate can be used to modify the conductivity of selected regions of the substrate, thus enabling the fabrication of electronic structures such as transistors. It is also known to prepare buried films of silicon dioxide ($SiO_2$) by implanting oxygen (O) ions into an Si substrate. The substrate is subsequently annealed, during which covalent bonds form between the implanted O and the Si substrate to provide $SiO_2$. Buried films of $SiO_2$ prepared by ion implantation have been used, for example, as "barrier layers" that prevent electrical conduction between layers above and below the $SiO_2$.

Although films thus formed may in some circumstances be sufficient for conventional applications, the films may suffer from defects. For example, a film intended to be continuous may not actually be continuous, but instead may include large numbers of inclusions and clusters. Or, even if a film is continuous, the interface between the film and the substrate may not be smooth, but instead may include nodule growths. Additionally, it may be difficult, or impossible, to control the phase of the film, potentially resulting in suboptimal performance for a particular application. For example, different phases of a particular material may have drastically different physical, electrical, and/or thermal properties from one another.

Other failings of conventional processing include a limited choice of materials and a restricted range of potential changes to the substrate.

SUMMARY

Embodiments of the invention provide systems and methods for preparing films using sequential ion implantation, and films formed using same.

In accordance with one aspect, a structure prepared using ion implantation includes a substrate; a structure embedded within the substrate and having pre-selected characteristics; and a film within or adjacent to the embedded structure, the pre-selected characteristics of the embedded structure having a pre-determined effect on the behavior of the constituents of the film causing the ions in the film to assume a perturbed arrangement. Specifically, local or global changes to the substrate, induced by the embedded structure, produce a modified environment into which the ions are implanted; these changes permit control over the structure and properties of the resulting material by changing the local chemical potential energy difference that would otherwise drive diffusion, by changing the kinetics of the transport process, or some combination of the two.

In some embodiments, the perturbed arrangement results in the ions being covalently bonded to each other, to the embedded structure, or to the substrate, whereas in the absence of the embedded structure the ions may be capable of diffusing through the substrate. The embedded structure may impede diffusion of the ions through the substrate. Such an impediment, for example, may cause the ions instead tend to covalently bond to one another, to the embedded structure, or to the substrate.

In some embodiments, the embedded structure includes $SiO_2$, the substrate includes Si, and the ions include C. The film may include diamond-like carbon, graphene, or SiC having a pre-selected phase.

The film may function as a barrier layer within the substrate. Such a barrier layer may provide a barrier to transport of energy or of mass, that is, it may restrict, isolate, or contain the transport of energy or mass through the substrate. The barrier layer may include, for example, an electrical conductivity barrier, a thermal conductivity barrier, a diffusion barrier, or some combination of the above. Or, for example, the film may have a higher refractive index than the embedded structure, so that together the film and the embedded structure form a waveguide that facilitates light transport within the waveguide while restricting or inhibiting light transport out of the waveguide and into the substrate. The lower-index embedded structure may at least partially surround, and clad, the higher-index film. Another example is a laser enhanced chlorine etch of silicon in a silicon oxide layer sandwich. The silicon oxide layers may limit the transport of heat out of the silicon layer, enhancing the rate of reaction of laser-enhanced etch of the silicon.

In some embodiments, the film is formed by implanting ions of a first type into or adjacent to the embedded structure and then annealing the substrate. Additionally, the embedded structure may be formed by implanting ions of a second type into the substrate, the second type being different from the first type. In some embodiments, the properties of the film may be controlled, for example, by adjusting the processing to which the embedded structure and/or the film are subjected. For example, the implanted ions of the second type may chemically react or undergo a phase transition if the substrate is annealed. As such, the characteristics of the embedded structure are determined, in part, by whether the substrate is annealed after implanting the ions of the second type; such characteristics will in turn determine the characteristics of the later-formed film. For example, if the embedded structure is annealed so as to form a barrier layer before implanting ions of the first type, the barrier layer may restrict diffusion of the ions of the first type into the substrate. Or, for example, if the embedded structure was not annealed and did not form a barrier layer, then the embedded structure may instead enhance diffusion of the subsequently implanted ions of the first type into the substrate, e.g., upon heating. The perturbations to the local environment of the first type of ions can take a variety of other forms.

In accordance with another aspect, a method for preparing a film using ion implantation includes providing a substrate; embedding a structure within the substrate, the structure having pre-selected characteristics; and implanting ions within or adjacent to the embedded structure to form a film, the pre-selected characteristics of the embedded structure having a predetermined effect on the behavior of the ions.

In some embodiments, the ions forming the film include ions that covalently bond to one another, to the embedded structure, or to the substrate, rather than remaining capable of diffusing through the substrate. The embedded structure may impede diffusion of the ions through the substrate, causing the ions to instead covalently bond to one another, to the embedded structure, or to the substrate. Non-covalent impediments to diffusion may also be used.

In some embodiments, embedding the structure includes implanting ions of a type different from the ions that form the film, and annealing the substrate.

The method may further include removing a portion of the substrate overlying the film and/or removing the embedded structure to at least partially expose the film and/or embedded structure.

Under still another aspect, a system for preparing a film using ion implantation includes an ion source; a stage; a database storing processing information about the film to be prepared, the stored information including information about a substrate, a structure embedded within the substrate, an ion type, and ion source and stage parameters for preparing the film by implanting ions of the ion type within or adjacent to the embedded structure; and a controller including a processor, a memory, an input device for receiving user input, and a display device for displaying information, and being in operable communication with the ion source, the stage, and the database. The controller, responsive to user input, obtains the processing information from the database, and responsive to that processing information, controls the ion source and stage in accordance with the parameters to prepare the film by implanting ions of the ion type within or adjacent to the embedded structure.

The embedded structure fabrication processes described herein may be used to make a variety of different devices, or arrays of devices, examples of some of which are provided herein. Other types of devices are possible.

DETAILED DESCRIPTION

Although ion implantation has been used for many years to prepare certain types of films, sequential ion implantation has not yet been exploited to prepare films having tailored and well-controlled properties. The present inventors have recognized that the physical properties of a substrate may be methodically altered, e.g., by implanting ions of a first type, such that when ions of a second type are subsequently implanted, the resulting film has a desired set of physical properties that may be significantly different than those resulting from implantation of the second ions alone. For example, an embedded structure may be formed within the substrate, e.g., by implanting ions of a first type. When ions of a second type are subsequently implanted into or adjacent to the embedded structure, that structure influences the behavior of the second type of ions compared to their behavior in the absence of the embedded structure, causing those ions to instead assume a perturbed arrangement. This perturbed arrangement of ions provides a different type of film than would otherwise form in the absence of the embedded structure. Without wishing to be bound by theory, it is believed that the embedded structure modifies the local environments experienced by the subsequently implanted ions, driving those ions to favor different kinetic and thermodynamic processes (including diffusion and nucleation) than they would without the embedded structure present. Thus, by controlling the characteristics of the embedded structure, the properties of a film buried within or adjacent to that embedded structure may be precisely controlled. As such, embodiments of the present invention enable the preparation of different types and configurations of films, and films of higher quality, than could otherwise be obtained using conventional ion implantation. Such improved films have numerous applications, including microelectromechanical systems (MEMS), nanoelectromechanical systems (NEMS), waveguides, and electronic devices, among others, as described in greater detail below.

Figure 1A:
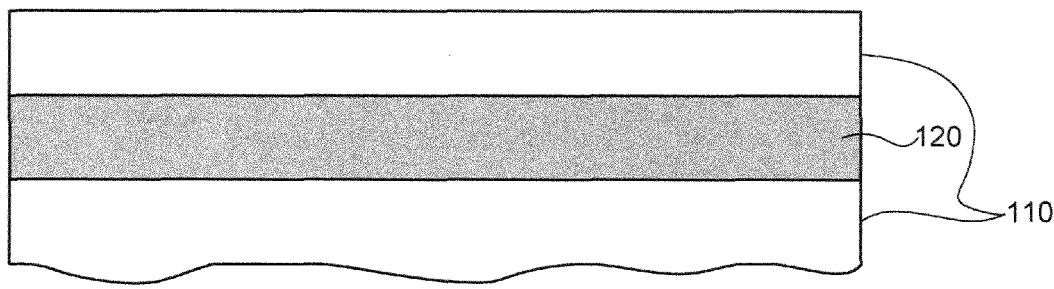
FIGS. 1A-1C illustrate cross-sectional views of exemplary structures that may be formed using conventional ion implantation.
Figure 1B:
Figure 1C:
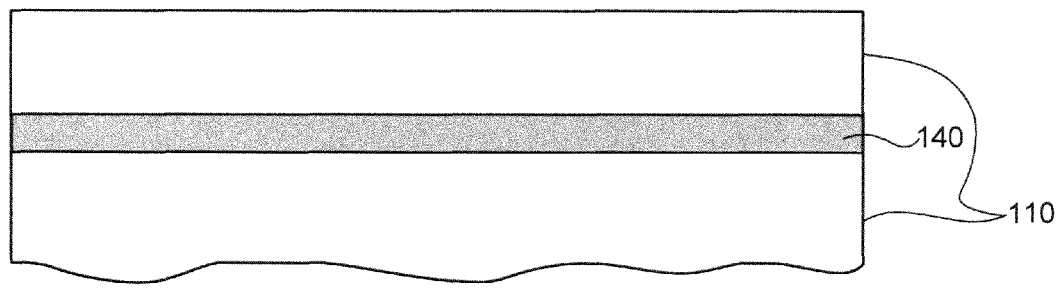

To aid in understanding the preparation of films using sequential ion implantation, a brief description of the preparation of films using previously known single ion implantation techniques is provided with reference FIGS. 1A-1C, which illustrate cross-sectional views of exemplary structures that may be prepared using single ion implantation. FIG. 1A illustrates layer 120 of ions immediately following their implantation into substrate 110. Those of ordinary skill in the art will recognize that the concentration of implanted ions is not necessarily uniform throughout the thickness of layer 120, but instead may vary. For example, the ions may have a Gaussian distribution throughout the thickness of layer 120, with the greatest concentration of ions being approximately in the middle of layer 120. Such a Gaussian distribution may arise from a Gaussian distribution of the energies of at which the ions are implanted.

Depending on the chemical potential of the ions, they may subsequently undergo transport, diffuse or concentrate within the substrate over time, or upon subsequent processing such as heating or annealing. For example, as illustrated in FIG. 1B, ions from layer 120 may diffuse through substrate 110, providing layer 130 having increased thickness, and lower concentration, relative to layer 120. Layer 130 may extend through the entire thickness of substrate 110, or a portion thereof. The concentration of ions may be approximately uniform throughout the thickness of layer 130, or may be approximately Gaussian, or have a still different concentration profile, depending on the transport kinetics and extent to which the ions diffuse through the substrate, the type of processing performed, and the chemical potential between the ions and the substrate. Alternatively, for example, as illustrated in FIG. 1C, the ions from layer 120 may concentrate within substrate 110, providing layer 140 having decreased thickness, and higher concentration, relative to layer 140. The concentrated ions in layer 140 may, for example, covalently or ionically bond to each other or to the substrate, or may cause other local changes to the substrate. One well-known example of such a change is the change in substrate conductivity induced by implanting an n- or p-type dopant. In one embodiment, the ions are monodispersed.

The tendency of ions in layer 120 to diffuse or concentrate within the substrate depends, among other things, on the compositions of the ions and the substrate, and the type of processing to which they are subjected following implantation, all of which affect the chemical potential energy environment of the implanted ions. Certain types of ions in a particular type of substrate may have relative chemical potential energy differences that drive the ions to diffuse through the substrate, while other types of ions in the same type of substrate may have chemical potential energy differences that drive the ions to instead aggregate. For example, certain types of metal ions implanted into Si are expected to diffuse upon annealing, while others are expected to concentrate. Or, for example, O ions implanted into Si are expected to concentrate upon annealing by bonding to Si in nucleation regions, from which $SiO_2$ grows epitaxially, whereas C ions implanted into Si are expected to concentrate upon annealing by bonding to Si to form a polycrystalline SiC film, the phase of which may be poorly controlled.

Figure 2A:
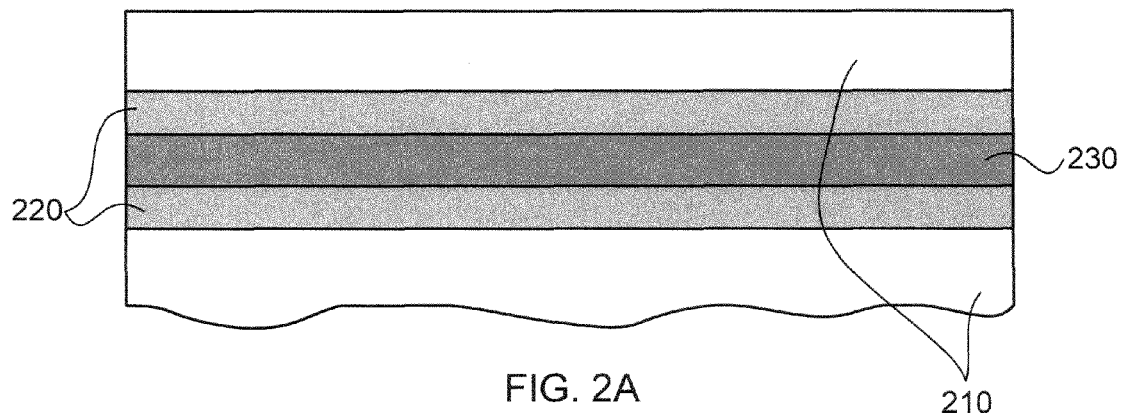
FIGS. 2A-2C illustrate cross-sectional views of exemplary structures that may be formed using sequential ion implantation, according to some embodiments.
Figure 2B:
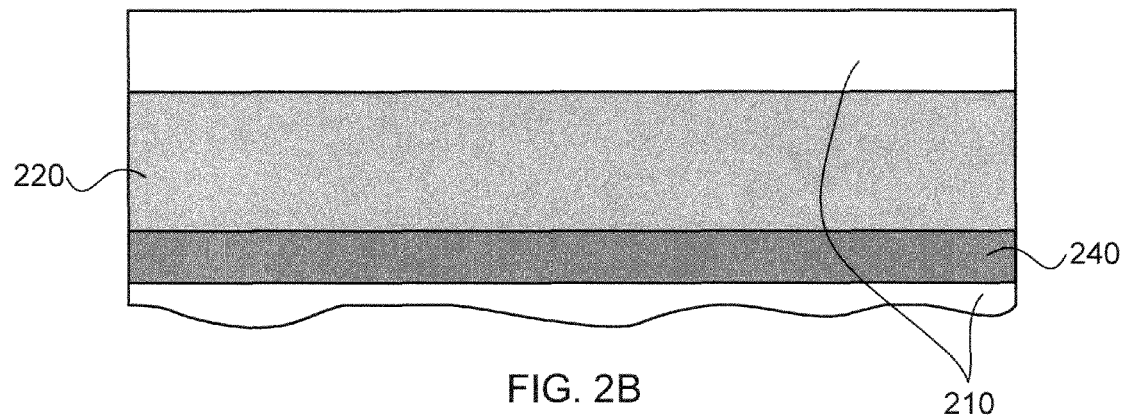
Figure 2C:
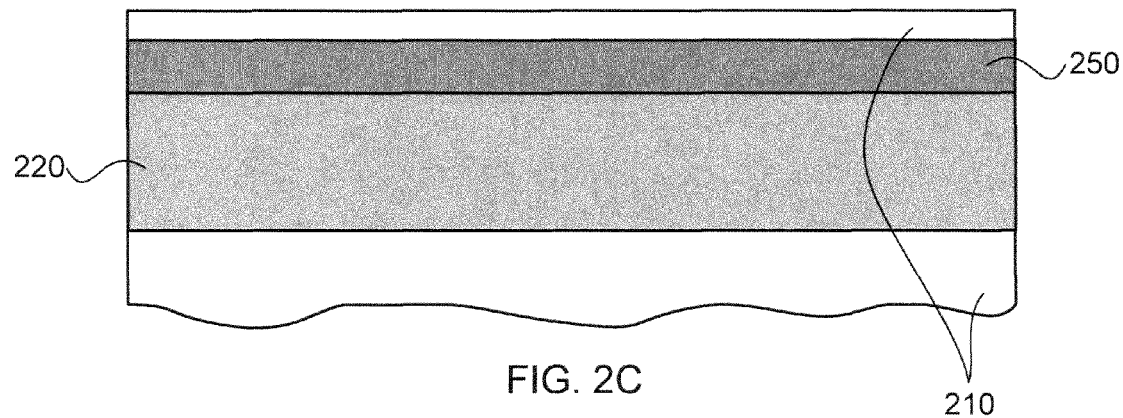

By contrast, the sequential ion implantation techniques in accordance with one or more aspects of the present invention may be used to alter the conventional behavior of ions, causing them to obtain perturbed arrangements. FIGS. 2A-2C illustrate cross-sectional views of exemplary structures that may be formed using sequential ion implantation, according to some embodiments. In such structures, the chemical potential energy difference between ions and a substrate is modified by the presence of an embedded structure, which may have been formed using a previously implanted ion, that causes the subsequently implanted ions to favor a different kinetic or thermodynamic process than they would if the buried structure was absent. That is, the embedded structure modifies the chemical potential and local environment of the subsequently implanted ions. The change in chemical potential may, for example, reduce the tendency of the subsequently implanted ion to diffusively migrate, or may drive the subsequently implanted ion to concentrate, e.g., to bond to itself, to the embedded structure, or to the substrate.

Referring now to FIG. 2A, substrate 210 includes embedded structure 220 into which layer of ions 230 is implanted. The embedded structure 220 may, for example, include ions of a first type that were implanted and, following further processing (e.g., annealing), bonded to the substrate 210 or to each other. Embedded structure 220 impedes transport of the subsequently implanted ions of layer 230 into substrate 210. For example, embedded structure 220 may impede defect diffusion, grain boundary diffusion, or lattice diffusion of the ions of layer 230. For example, embedded structure 220 may inhibit or prevent the ions of layer 230 from diffusing both upwards and downwards, i.e., through the thickness of substrate 210, and optionally also may inhibit or prevent the ions of layer 230 from diffusing laterally. In other embodiments, the ions of layer 230 may be able to laterally diffuse. Because embedded structure 220 inhibits the motion of the ions of layer 230, the ions of layer 230 to may attain perturbed arrangements. For example, the constraint imposed by structure 220 may cause the ions of layer 230 to covalently or ionically bond to each other, to structure 220, and/or to substrate 210, which bonding would not otherwise have occurred in the absence of structure 220. The constraint imposed by structure 220 also may cause the ions of layer 230 to obtain a particular thermodynamic phase, e.g., a crystalline lattice (of which there may be many arrangements) or an amorphous phase. Thus, embedded structure 220 causes layer 230 to exhibit different properties than if structure 220 was absent (e.g., as illustrated in FIG. 1C). It should be noted that layer 230 need not be centered symmetrically within embedded structure 220, but may be located anywhere in the thickness of structure 220.

Alternatively, as illustrated in FIG. 2B, layer 240 of subsequently implanted ions may be implanted adjacent to, and immediately below, embedded structure 220, or, as illustrated in FIG. 2C, layer 250 of subsequently implanted ions may be implanted adjacent to, and immediately above, embedded structure 220. In the embodiment of FIG. 2B, structure 220 may inhibit or prevent the ions in layer 240 from diffusing upwards, whereas in the embodiment of FIG. 2C, structure 220 may inhibit or prevent the ions in layer 250 from diffusing downwards. In the embodiments of FIGS. 2B and 2C, structure 220 causes an asymmetrical modification to the chemical potentials of the ions of layers 240 and 250, causing those ions to assume a perturbed arrangement, e.g., to diffuse and/or react differently than if they were instead embedded within structure 220 (e.g., as illustrated in FIG. 2A), or embedded directly in substrate 210 (e.g., as illustrated in FIG. 1C). For example, embedded structure 220 may attract the ions of layer 240 or 250, causing those ions to concentrate at or adjacent to an interface between structure 220 and 240 or 250, where they may covalently or ionically bond with each other or with the substrate, and/or form a particular thermodynamic phase, such as a crystalline lattice or amorphous phase. In some embodiments, two or more different types of ion may be sequentially implanted to form layer 230, 240, or 250, and the ions may bond with each other, with the embedded structure, and/or with the substrate to form a complex species, e.g., a species comprising three or more different types of atoms. In one example, two different types of ion are implanted, and bond to the substrate or to the embedded structure, to form a ternary species.

Other configurations are possible. For example, as elaborated below, the embedded structure and/or the film may be patterned to provide a device having a desired physical, electrical, and/or thermal functionality. Or, for example, the embedded structure and/or the film may be located at varying locations through the depth of the substrate. In some embodiments, the embedded structure is located at the top surface of the substrate, such that there is no intervening layer of substrate over the embedded structure. In other embodiments, the embedded structure is buried within the substrate, and the film is positioned over the embedded structure and fills substantially the entire volume between the embedded structure and the top surface of the substrate, such that there is no intervening layer of substrate over the film.

Figure 3:
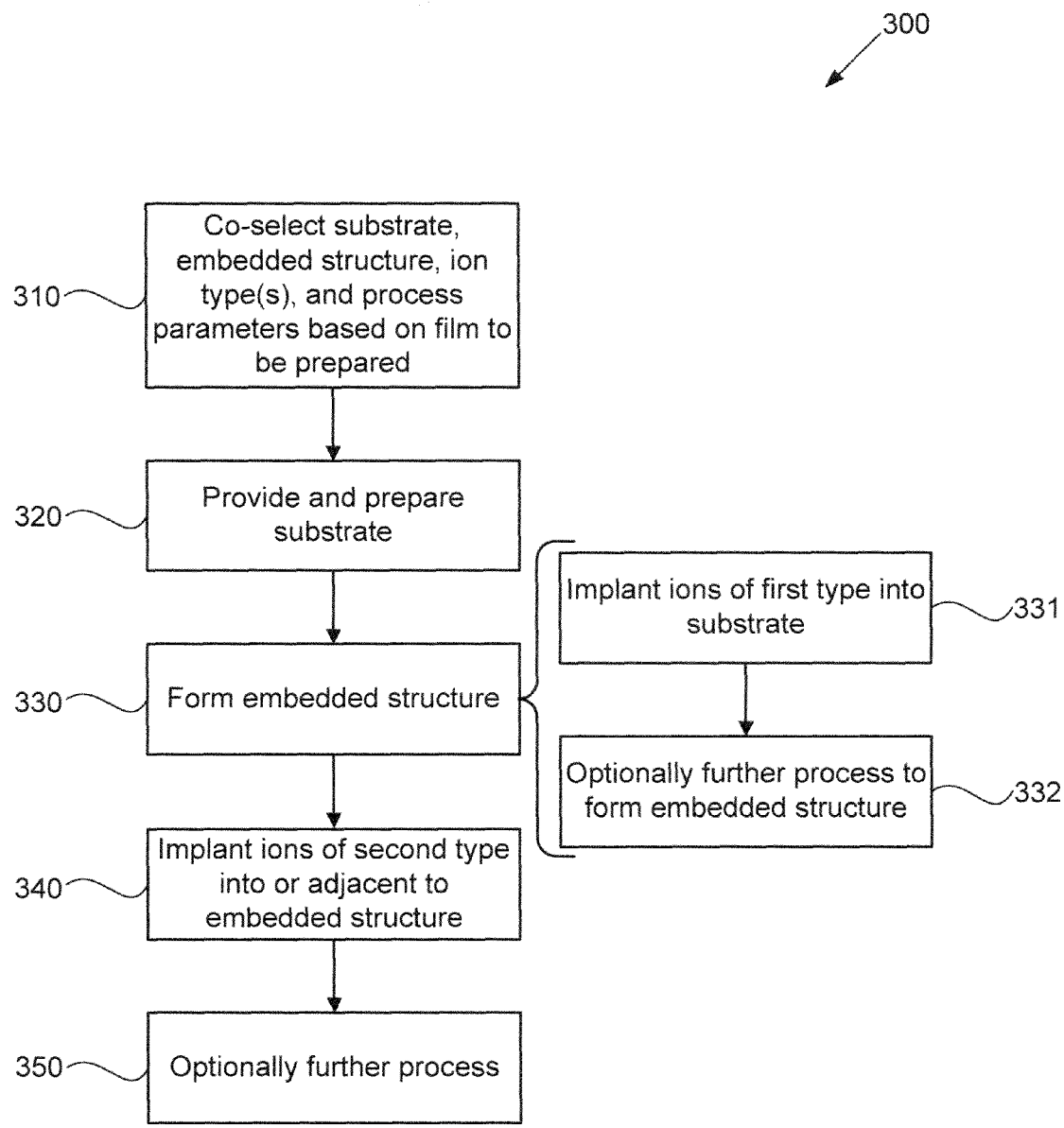
FIG. 3 is a flow chart of steps in an illustrative method for preparing a film using sequential ion implantation, according to some embodiments.

FIG. 3 illustrates an overview of an exemplary method 300 for preparing a film, e.g., for preparing layer 230, 240, or 250 described above, using sequential ion implantation, and FIGS. 4A-4F illustrate exemplary structures that may be formed using such a method.

With respect to FIG. 3, based on a film type to be prepared, a substrate, an embedded structure (which may itself be prepared using ion implantation), ion type(s), and process parameters are co-selected (310). Specifically, the substrate, embedded structure, and processing parameters associated therewith are co-selected to modify the physical properties of the substrate such that, when the second type of ion is later implanted into or adjacent to the embedded structure, and optionally further processed, the second type of ion obtains a desired perturbed arrangement and thus forms the desired type of film.

The selected processing parameters include ion implantation doses and energies, and any additional (e.g., non-ion implantation) processing to be performed. The doses and energies are selected to provide appropriate stoichiometric ratios between the implanted ions, the substrate, and the embedded structure for preparation of the desired film. The additional processing is selected to encourage the appropriate interactions between the ions, the embedded structure, and the substrate, for example, to encourage covalent bonds to form, or to encourage a predetermined amount of diffusion to occur, or to encourage nucleation of ions into a particular thermodynamic phase, e.g., a crystalline lattice or an amorphous phase.

Then, the selected substrate is provided and prepared (320). Non-limiting examples of suitable substrates include silicon, germanium, gallium phosphide, gallium nitride, gallium arsenide, and indium phosphide. The substrate may, for example, be a wafer, e.g., a single-crystal wafer, or may be a film disposed on a solid support such as glass or sapphire. The substrate may be monocrystalline, and optionally may have a particular crystalline orientation. For example, Si substrates are available in various crystallographic orientations, such as [100] or [111], either of which may be suitable. Alternatively, the substrate may be polycrystalline, or even amorphous.

Figure 4A:
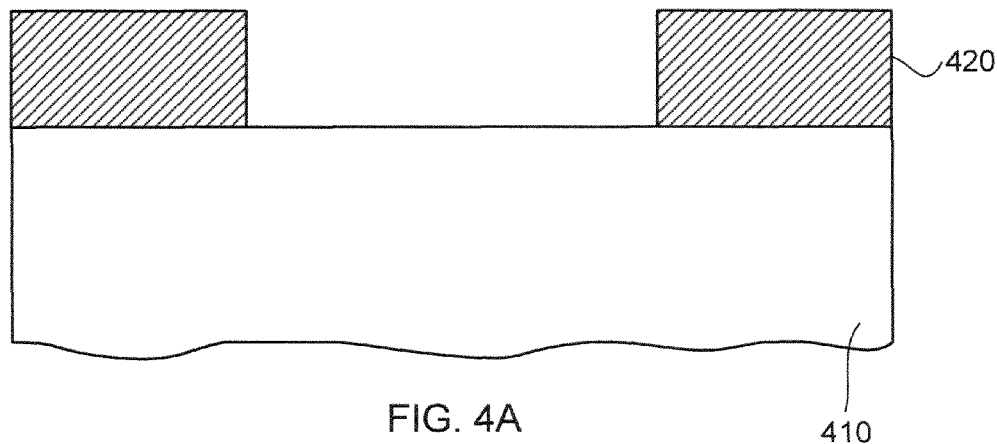
FIGS. 4A-4F illustrate cross-sectional views of structures that may be formed while preparing a film using sequential ion implantation, according to some embodiments.

Depending on the desired application of the film to be prepared, it may be desired to form the embedded structure in accordance with a pattern. If so, the substrate may be prepared to include a patterned mask that defines regions in which the embedded structure is to be formed. For example, if the embedded structure is to be formed by implanting ions of a first type, the patterned mask may substantially prevent those ions from becoming implanted anywhere other than in desired regions. For example, as illustrated in FIG. 4A, a patterned mask 420 may be provided on the upper surface of substrate 410 using techniques well-known in the art, e.g., using deposition and lithographic patterning. Mask 420 may inhibit or prevent ions of the first type from penetrating into the regions of substrate 410 upon which it is disposed, and thus may define the lateral features of the embedded structure 440 to be prepared during later steps. Alternatively, directed ion beams may be used to implant ions in accordance with a desired pattern, thus obviating the need to use a patterned mask. In still other embodiments, the embedded structure is to be substantially uniform across the entirety of substrate 410, in which case no pattern need be defined. Thus, although the embodiments described below utilize a patterned mask, it should be clear that masks are optional.

The embedded structure is then formed (330). In many embodiments, and in the examples provided below, the embedded structure is formed by implanting ions of a first type into the substrate (331) and then optionally further processing the substrate to form the embedded structure (332). Forming embedded structures using ion implantation may be convenient because a relatively low number of processing steps are required, and in some circumstances the substrate may remain in place during the formation both of the embedded structure and desired film. However, it should be clear that embedded structures may also be formed using other suitable methods, such as any suitable combination of conventional photolithography, chemical vapor deposition, sputtering, electroplating, and the like. The embedded structures thus formed may still modify the chemical potential energy environment of the subsequently implanted ions. Indeed, embedded structures formed using different methods, but having comparable compositions, may themselves have subtle structural differences. As such, ions implanted into embedded structures formed using different methods may have different chemical potentials and thus form films having different characteristics from one another. Thus, selection of the particular method by which the embedded structure is formed may provide still further control over the characteristics of the film formed using the subsequently formed ions. One example of a suitable method for preparing an embedded structure includes treating a specified region of the substrate with a laser to locally anneal that region, thus modifying its properties, the modified region constituting the embedded structure. Or, for example, an oxide or nitride may be deposited onto the substrate, and ions may diffuse out of that oxide or nitride and into a local region of the substrate to form the embedded structure. Any other suitable method alternatively may be used.

Figure 4B:
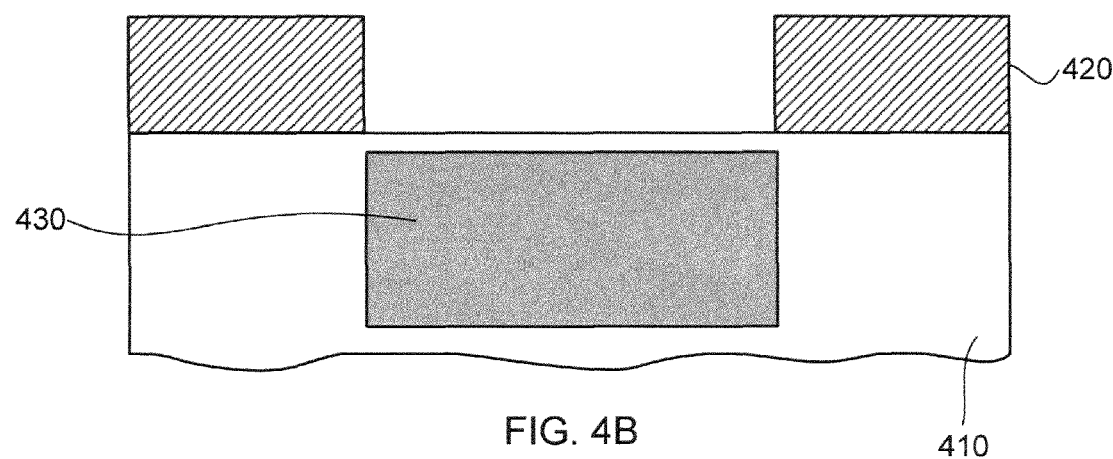

In embodiments in which the embedded structure is formed using ion implantation, some non-limiting examples of suitable ions implanted in step 331 include O, H, C, and N. As illustrated in FIG. 4B, the first ion type may form layer 430 within substrate 410 having lateral dimensions defined by mask 420. The depth and thickness of the layer 430 is based, among other things, upon the energy of the first ion type, and the distribution of that energy. The substrate 410 may also be heated during this step to reduce damage to the substrate caused by the ion implantation, by annealing dislocations caused by ions as they pass through the substrate.

The depth and thickness of the implanted layer may vary depending on the desired characteristics of the film to be subsequently prepared. However, practical considerations may constrain the depth to which the ions may be implanted. For example, an ion source capable of generating energies on the order of keV may only be capable of implanting ions to a depth of about 1 µm or less, whereas an ion source capable of generating greater energies may be capable of implanting ions to a greater depth. In some embodiments, the ions are implanted to a depth of between 10 nm and 10 µm, or between 10 nm and 5 µm, or between 10 nm and 1 µm, or between 50 nm and 500 nm, or between 1 µm and 5 µm, or between 5 µm and 10 µm, or some other depth. In some embodiments, the thickness of the implanted layer of ions is between 10 nm and 1 µm, or between 10 nm and 500 nm, or between 10 nm and 200 nm, or between 10 nm and 100 nm, or between 10 nm and 50 nm, or between 50 nm and 100 nm, or between 1 nm and 10 nm, or between 1 nm and 5 nm. Additionally, as is known to those of skill in the art, thicker layers may be prepared using multiple implantations of the same type of ion with varying energies, to penetrate further or shallower within the substrate.

Figure 4C:
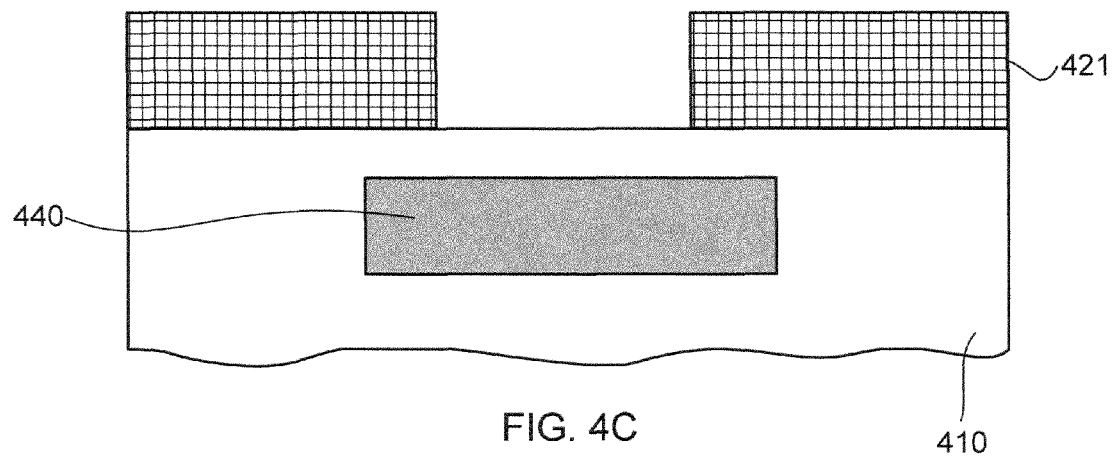
Figure 4D:
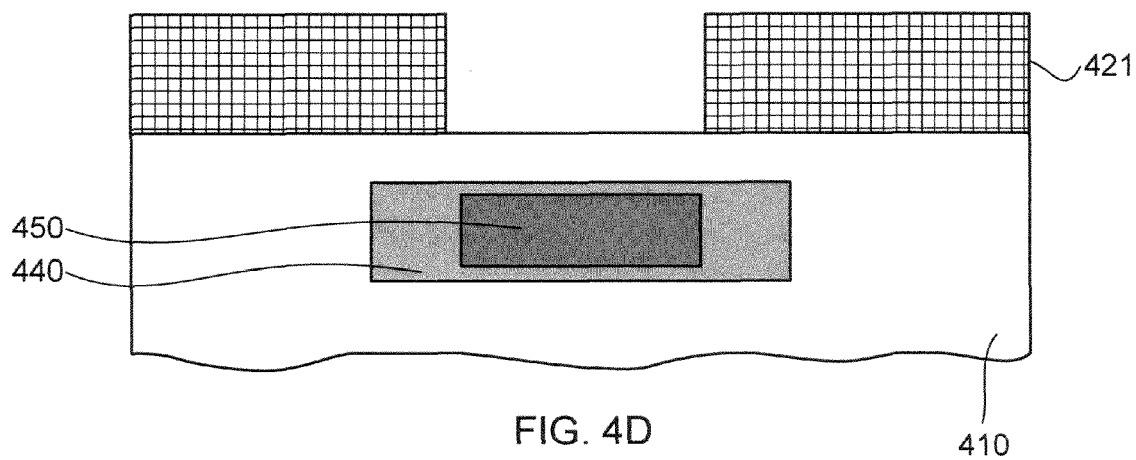
Figure 4E:
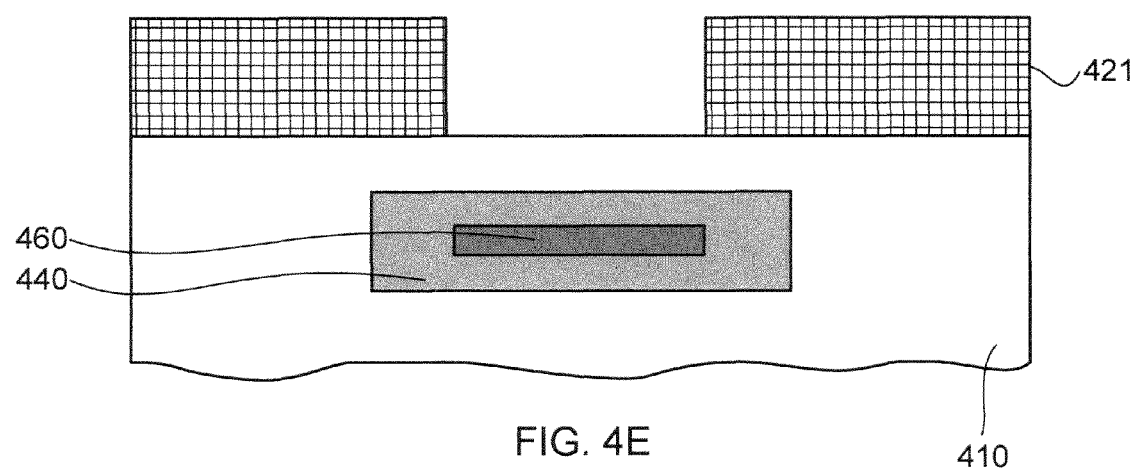

After implanting the ions of the first type into the substrate, the substrate is then further processed to form the embedded structure (332). For example, the substrate may be annealed, causing the ions of the first type to concentrate, e.g., to bond to the substrate or to nucleate. As illustrated in FIG. 4C, such further processing may cause layer 430 to contract into embedded structure 440 that is thinner than layer 430 and in which the ions of the first type are bonded to the substrate. For example, if the substrate is Si and the first ion type is O, then an anneal step may be used to cause the implanted O ions to bond to the Si substrate to form an embedded $SiO_2$ structure. In other embodiments, further processing may not be required to form an embedded structure; that is, further processing step 340 may in some cases be optional. Another example of intermediate processing is defining a pattern with which the ions of the second type will be implanted into the substrate. For example, mask 420 may be removed and mask 421 having a different pattern may be provided on substrate 410. In the embodiment illustrated in FIG. 4C, mask 421 defines a smaller aperture than did mask 420, so the second ion type will be implanted with a smaller lateral dimension than embedded structure 440 has. In alternative embodiments, the embedded structure is formed using patterning but the subsequently prepared film is prepared without patterning, or the embedded structure is formed without patterning but the subsequently prepared film is prepared using patterning.

The ions of the second type are then implanted into or adjacent to the embedded structure (340). Non-limiting examples of suitable second ion types include C, N, and O. In the embodiment illustrated in FIG. 4D, the ions of the second type form a layer 450 that is buried substantially entirely within the embedded structure 440. Other exemplary configurations for layers formed using the ions of the second type are described further below with reference to FIGS. 5A-6D. The lateral dimensions of layer 450 are defined by mask 421, and the thickness and depth are defined by the dose and energy with which the second ion type is implanted. Additionally, the presence of embedded structure 440 may reduce or increase the amount of energy required to implant layer 450 at the desired depth. For example, if the embedded structure 440 includes $SiO_2$, then the amount of energy required to implant layer 450 within structure 440 may be reduced due to the characteristics of the $SiO_2$. The substrate may also be heated during this step to reduce damage to the substrate and/or to the embedded structure 450 caused by dislocations generated by ions passing through the substrate or embedded structure, as mentioned above. In some embodiments, the ions are implanted to a depth of between 10 nm and 10 μm, or between 10 nm and 5 μm, or between 10 nm and 1 μm, or between 50 nm and 500 nm, or between 1 μm and 5 μm, or between 5 μm and 10 μm, or some other depth. In some embodiments, the thickness of the implanted layer of ions is between 10 nm and 1 μm, or between 10 nm and 500 nm, or between 10 nm and 200 nm, or between 10 nm and 100 nm, or between 10 nm and 50 nm, or between 50 nm and 100 nm, or between 1 nm and 10 nm, or between 1 nm and 5 nm. Additionally, as mentioned above, multiple implantations of the ions of the second type, using varying energies may be used to create thicker layers as appropriate.

Figure 4F:
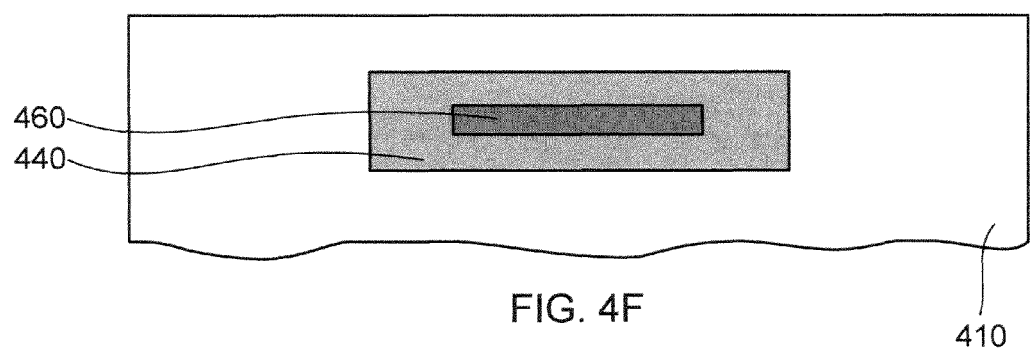

The substrate, with the embedded structure and the ions of the second type implanted therein, is then optionally further processed (350). For example, the substrate may be annealed, which may drive the second ion type to concentrate, e.g., to covalently or ionically bond to itself, to the first ion type, or to the substrate, and/or to arrange into a particular thermodynamic phase, such as a crystalline lattice or amorphous phase. In some embodiments, absent the embedded structure, the ions of the second type would instead tend to diffuse through the substrate upon annealing. In the embodiment illustrated in FIG. 4E, layer 440 physically constrains layer 450, causing the ions of the second type to assume a perturbed arrangement, in which they concentrate into layer 460, i.e., the desired layer to be formed, which is buried within structure 440. Layer 460 may then be used as it is, or may be still further processed, e.g., to remove mask 421, as illustrated in FIG. 4F.

A variety of films may be formed using the method of FIG. 3, including but not limited to diamond-like carbon films, graphene films, and SiC films having pre-selected phase. The films may be continuous, smooth, and/or have substantially a single phase, whereas conventionally formed films may suffer from discontinuities, have nodule growths causing surface roughness, and poor or no phase control. Additionally, the method of FIG. 3 may be used to form films having any desired lateral dimension by patterning the ions being implanted, e.g., using masks or a patterned ion beam, and further having any desired vertical dimension by controlling the dose and energy of the ions as they are implanted.

The phrase "diamond-like carbon films" means films formed primarily of C, or essentially of C, or even completely of C. As described in greater detail below, such films may be formed, for example, in a Si substrate having an $SiO_2$ structure embedded therein, which optionally may be formed by implanting O ions into the substrate. C ions that are implanted within the embedded $SiO_2$ structure and subsequently annealed, e.g., as illustrated FIG. 4F, will attain a perturbed arrangement due to the characteristics of the $SiO_2$ structure. Specifically, the C ions conventionally would be expected to diffuse through the substrate and form polycrystalline SiC; however, the characteristics of the $SiO_2$ structure may cause the implanted C ions instead to bond to each other, resulting in a "diamond-like" carbon film. Some characteristics of an example of such a film are described in greater detail below with reference to FIGS. 8A-9B.

Those skilled in the art may refer to a variety of different types of carbon films as "diamond-like" because they contain at least some $sp^3$-hybridized carbon atoms (pure diamond containing essentially only $sp^3$ hybridized carbon atoms). Such films are typically deposited onto the outer surfaces of objects, using conventional methods, to enhance the surface toughness of the objects. For example, there are several known types of "amorphous" carbon films that are applied to tools, the strongest being tetrahedral amorphous carbon, or ta-C, which contains essentially only $sp^3$ hybridized carbon atoms. Other types of amorphous carbon films include mixtures of $sp^2$ and $sp^3$ hybridized carbon atoms and/or dopants such as hydrogen and/or metal. Such films may be prepared using well-known processes by rapidly cooling high energy carbon atoms on a surface, e.g., using plasma deposition or sputtering. The carbon atoms thus deposited are generally unable to obtain any long-range order, so different regions of the resulting film may include randomly intermixed cubic and hexagonal lattices. Such films have been observed to have a hardness similar to diamond, but are relatively flexible and conformable because there is no long-range crystalline structure, which is believed to cause brittleness. It is also well known to prepare crystalline carbon films, which may be referred to as nano-crystalline or microcrystalline, on a surface using chemical vapor deposition (CVD). Such crystalline films are conventionally referred to as "diamond" films and contain essentially only $sp^3$ hybridized carbon atoms.

Unlike previously known films, the diamond-like carbon films provided herein are not limited to deposition onto the surface of a substrate, but instead may be prepared at any desired depth inside of the substrate, and in any desired pattern. As such, the diamond-like films may provide functionalities not previously attainable, such as providing a barrier layer, an insulator layer, and/or a thermally conductive layer within the substrate. However, if desired, the diamond-like carbon films may be exposed by removing the portion of the substrate, and any other layers, over the films. Such exposed films may then be used as substrates for growing nanotubes or other suitable materials. Additionally, unlike conventionally prepared films, the diamond-like carbon films provided herein may have essentially only a single phase across the film. Such a phase may develop if the film is annealed at an appropriate temperature after C implantation. For example, in some embodiments the diamond-like carbon film may form essentially only a cubic lattice across the film, while in other embodiments the film may form essentially only a hexagonal lattice across the film. In still other embodiments, the film may have a mixture of cubic and hexagonal lattices, which may impart enhanced flexibility while still providing other diamond-like qualities. The apparatus used to implant the ions, e.g., the ion accelerator, may also enable various other sorts of selectivity. For example, an isotope of selected weight may be selected using a mass spectrometer, and then implanted.

Without wishing to be bound by theory, it is believed that if a sufficiently thin layer of C ions are implanted within or adjacent to an appropriate embedded structure, such as $SiO_2$, such ions may concentrate and bond together to form a film of graphene. As is known to those of ordinary skill in the art, graphene is a one atom-thick sheet of $sp^2$ hybridized carbon atoms. Such a graphene film could potentially be used as an ultra-thin electrical conductor embedded within the substrate, or for any other suitable purpose. For example, such a graphene film could be partially or completely freed from the substrate and used in a MEMS or NEMS device, as graphene is known to have the highest mechanical strength of any known material.

Embedded diamond-like carbon films may alternatively be used as an embedded structure to control the preparation of films formed during a subsequent ion implantation process. That is, a diamond-like carbon film may be used as the embedded structure of step 330 in FIG. 3, and a new layer of ions implanted within or adjacent to the diamond-like carbon film.

A structure such as that illustrated in FIG. 4F may be used for a variety of purposes. For example, if embedded structure 440 is an optically transparent material and layer 460 is an optically transparent material with a higher index of refraction than structure 440, then the structure 440, 460 may be used as an optical waveguide. In one embodiment of such a waveguide, substrate 410 includes Si, embedded structure 440 includes $SiO_2$, and layer 460 is a film having a higher index of refraction than $SiO_2$, such as diamond-like carbon. The embedded $SiO_2$ structure acts as a cladding layer surrounding layer 460, thus enabling layer 460 to efficiently transport light laterally across the substrate. In contrast, embedded $SiO_2$ structure 440 alone (e.g., absent diamond-like carbon layer 460) would not be an efficient waveguide, because the refractive index of the Si substrate is higher than that of $SiO_2$. As such, the embedded $SiO_2$ structure alone would simply allow light to leak out into the substrate, rather than transporting the light laterally across the substrate. Light may be coupled into layer 460 using any conventional means, such as a lens, a grating coupler, or a prism coupler (not illustrated). In some embodiments, such as illustrated in embedded $SiO_2$ structure 440 substantially completely surrounds layer 460. In other embodiments, structure 440 need not completely surround layer 460. For example, layer 460 may have the same lateral dimensions as structure 440 such that structure 440 is only in contact with, and disposed on, the top and bottom surfaces of layer 460.

Because the pattern of the implanted waveguide may easily be defined using only masks 420, 421, or even by omitting masks and instead patterning the ion beams, waveguides of any appropriate pattern may be formed without the need for complex processing. In some embodiments, for example, if layer 460 need not have smaller lateral dimensions than embedded structure 440, then mask 420 or the same ion beam pattern may be used during the preparation both of the embedded structure and layer 460, further simplifying the preparation of layer 460.

Figure 5A:
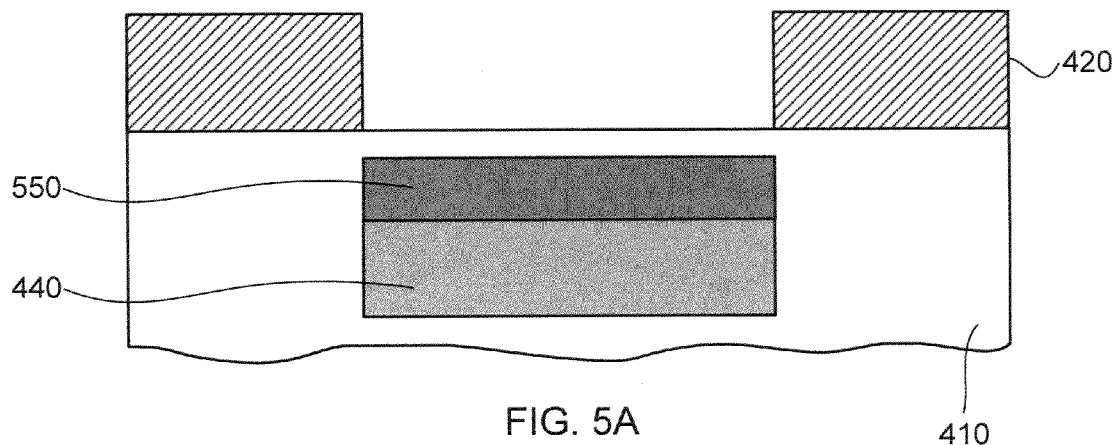
FIGS. 5A-5E illustrate cross-sectional views of alternative structures that may be formed while preparing a film using sequential ion implantation, according to some embodiments.
Figure 5B:
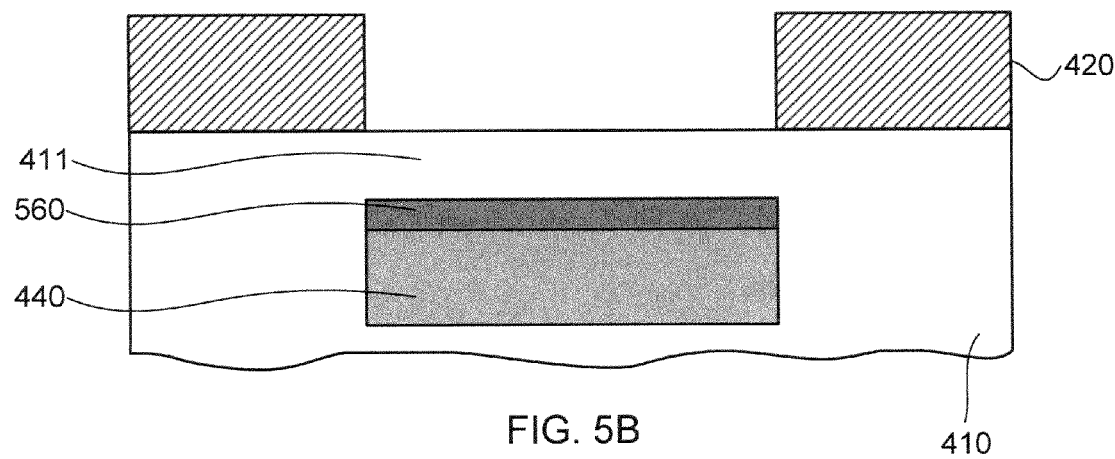
Figure 5C:
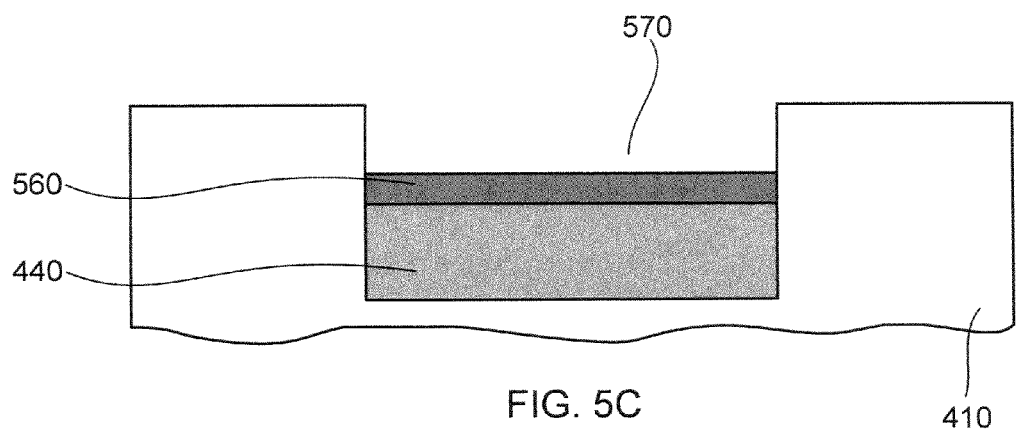

As noted above, in the method of FIG. 3, the ions of the second type can alternatively be implanted adjacent to embedded structure 440 during step 340. For example, as illustrated in FIG. 5A, layer 550 of ions may instead be implanted immediately above structure 440. During the additional processing of step 350, e.g., during an anneal step, the ions of layer 550 concentrate at or near the interface between embedded structure 440 and layer 550, forming layer 560 of reduced thickness relative to layer 550. Layer 560 may be used as it is, or alternatively may be exposed by removing portion 411 of the substrate overlying embedded structure 440, as illustrated in FIG. 5C. Suitable methods for removing such a substrate portion are described, for example, in U.S. Pat. No. 7,419,915, entitled "Laser Assisted Chemical Etching Method For Release Microscale and Nanoscale Devices," the entire contents of which are incorporated by reference herein.

Figure 5D:
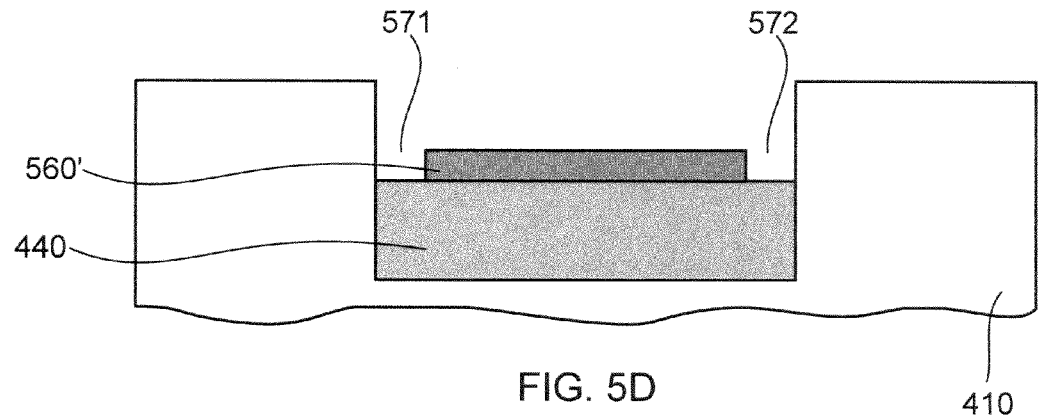
Figure 5E:
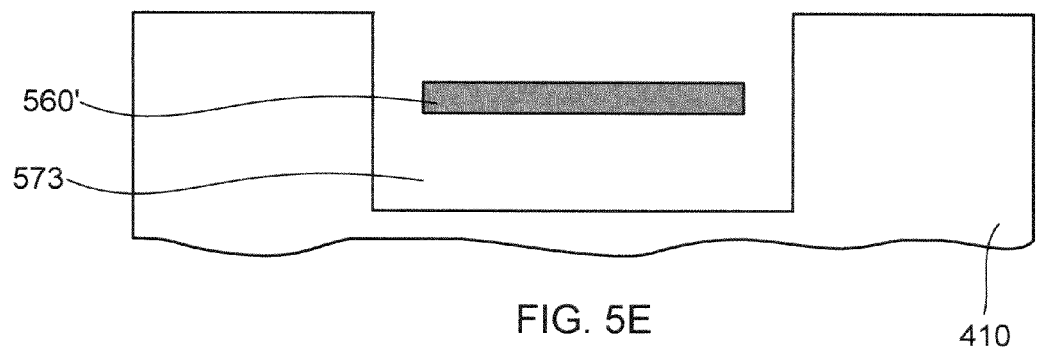
Figure 5F:
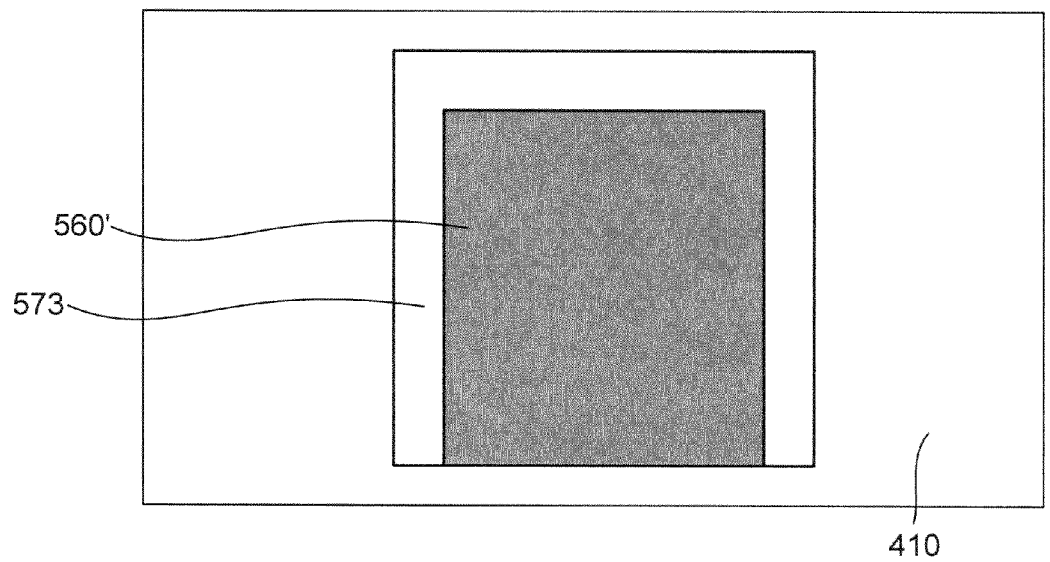
FIG. 5F illustrates a plan view of the alternative structure of FIG. 5E, according to some embodiments.

If desired, layer 560 further may be freed from embedded structure 440 by cutting alone one or more of its edges, e.g., using mechanical or laser-based cutting. For example, as illustrated in FIG. 5D, layer 560 may be cut along two or more of its edges, forming cavities 571 and 572 on either side of layer 560' having reduced lateral size as compared to layer 560. Additionally, if desired, embedded structure 440 may be removed, e.g., using conventional etching techniques, forming cavity 573 and freeing layer 560' partially or entirely from substrate 410, as illustrated in FIG. 5E. As illustrated in FIG. 5F, layer 560' optionally may be cut along three of its four edges, leaving it connected along one edge to substrate 410, and otherwise surrounded by cavity 573.

In one embodiment of the structure illustrated in FIGS. 5E-5F, substrate 410 includes Si, the first ion type is O, embedded structure 440 includes an $SiO_2$ layer, and the second ion type is C. During the anneal step, the C in layer 550 covalently bonds to itself, forming a diamond-like carbon layer 560. Conventionally, the carbon would instead be expected to form SiC. However, the presence of the $SiO_2$ layer drives the C to bond to itself, which is a perturbed arrangement, rather than to the Si substrate. The preparation and characteristics of an exemplary diamond-like carbon film are described in further detail below with respect to FIGS. 8A-9B.

Diamond-like carbon films need not necessarily be partially or entirely freed from substrate 410. For example, if configured as illustrated in FIG. 5B, diamond-like carbon film 560 may be used as a barrier layer, and/or to conduct heat from the substrate to a heat sink. Or, for example, if exposed but not freed from substrate 410 as illustrated in FIG. 5C, diamond-like carbon film 560 may be used as a substrate for the growth of carbon nanotubes, e.g., for use in a field emitter tip array. Or, for example, diamond-like carbon film of FIG. 5C may be used in place of a conventional diamond-like film, e.g., to protect a surface or to harden a tool.

Figure 6A:
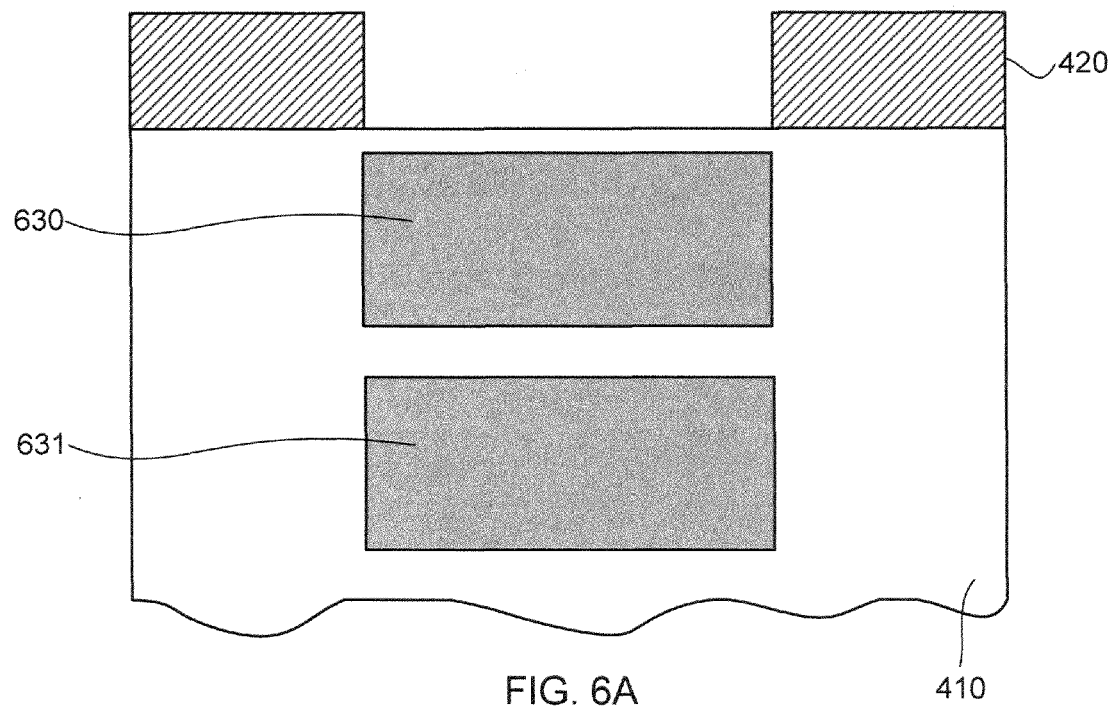
FIGS. 6A-6D illustrate cross-sectional views of alternative structures that may be formed while preparing a film using sequential ion implantation, according to some embodiments.
Figure 6B:
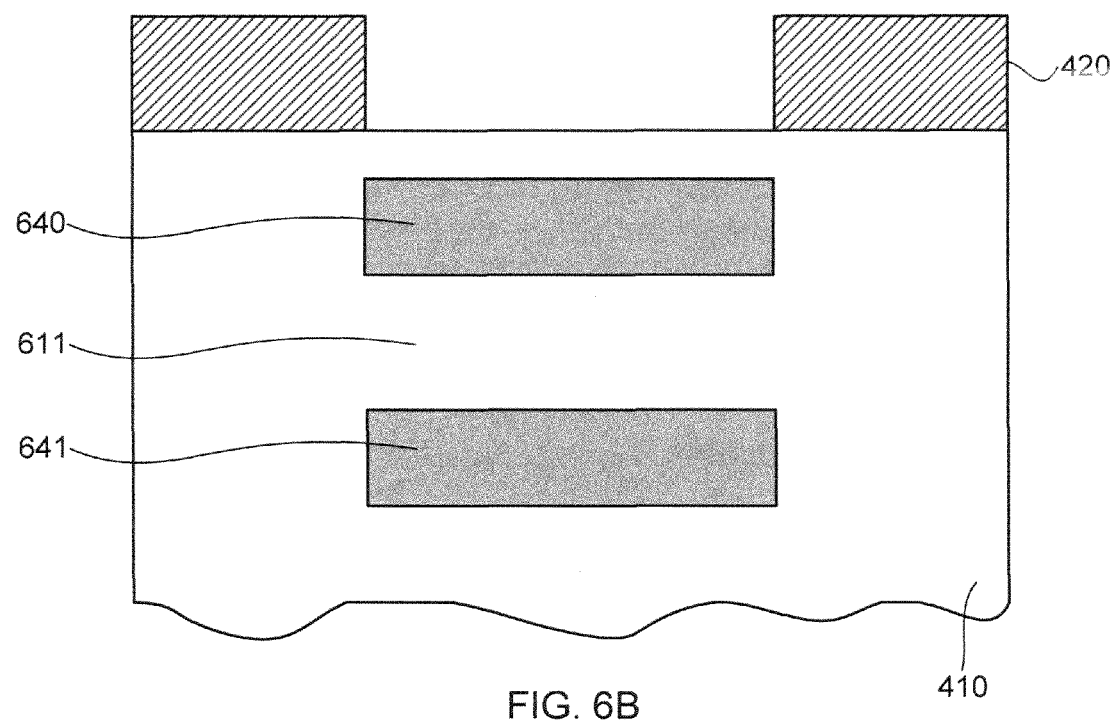
Figure 6C:
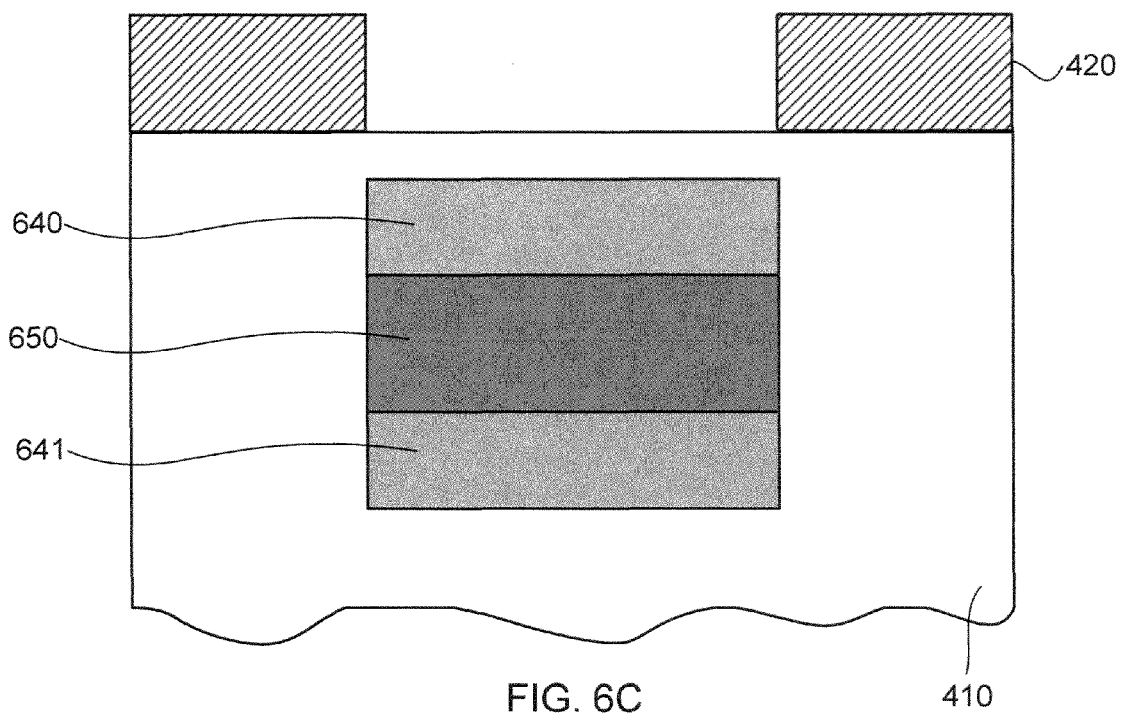
Figure 6D:
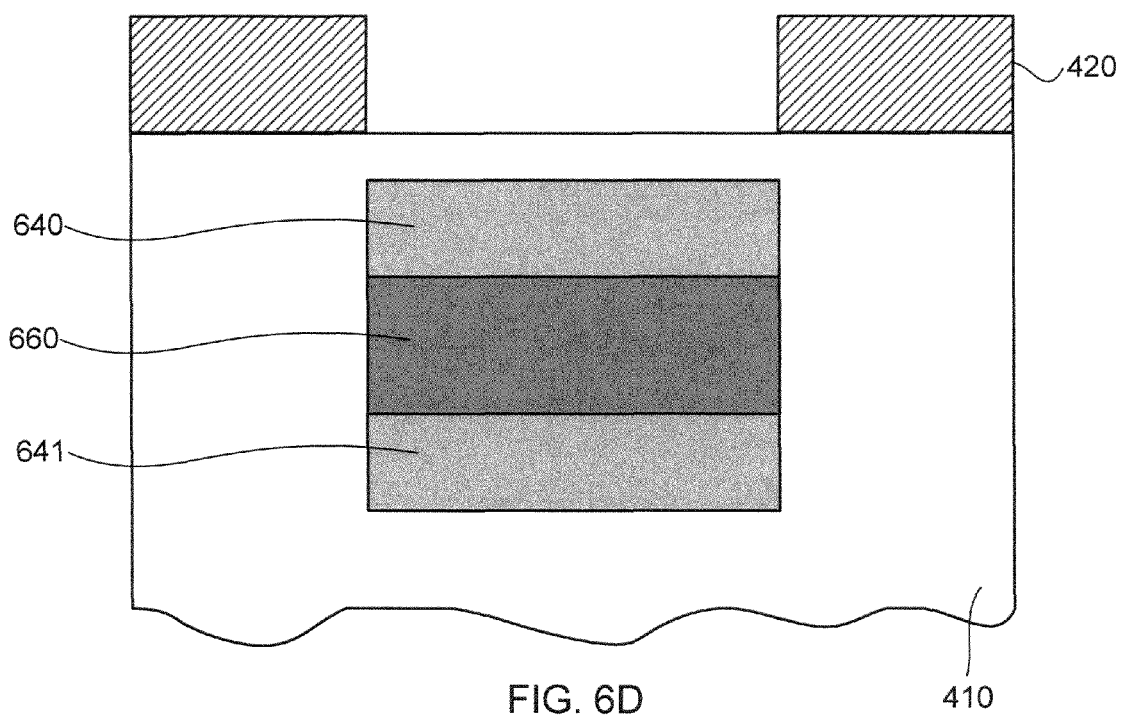

The method of FIG. 3 may also be modified to prepare more complex structures. For example, as illustrated in FIG. 6A, two separate layers 630, 631 may be formed, instead of single layer 430 illustrated in FIG. 4B. The two layers 630, 631 may be formed, for example, by implanting ions of a first type at two different energies, the difference between the energies being sufficiently great to form two separate structures. As illustrated in FIG. 6B, during additional processing, such as an anneal, the ions in layers 630, 631 may concentrate to form two embedded structures 640, 641, thus increasing the thickness of substrate portion 611 disposed between layers 640, 641. As illustrated in FIG. 6C, ions of a second type then may be implanted into substrate portion 611, between and adjacent to structures 640, 641. Layers 640, 641 may constrain the ions of layer 650, causing them to assume a perturbed arrangement, such as bonding to each other or to the portion of substrate 611 to form layer 660, illustrated in FIG. 6D. In one example, the substrate includes Si, the first ion type is O, embedded structures 640, 641 include $SiO_2$, and the second ion type is C. During an anneal, the C bonds to the Si, forming an SiC layer 660 sandwiched between layers 640, 641. The phase of the SiC thus formed may be selected by adjusting the anneal temperature and pressure, thus enabling layer 660 to be used for a variety of applications depending on the phase selected.

Figure 7:
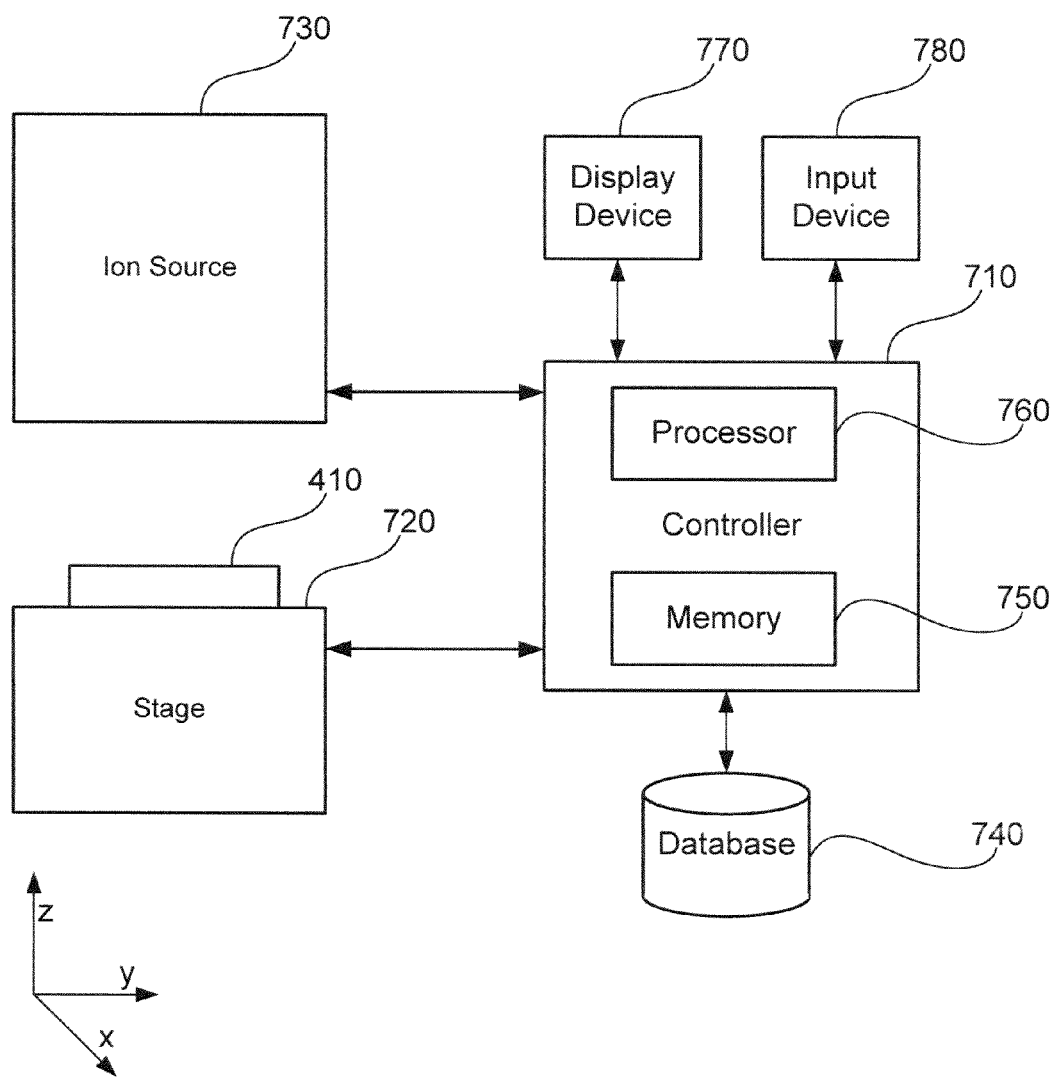
FIG. 7 schematically illustrates a system for preparing a film using sequential ion implantation, according to some embodiments.

FIG. 7 illustrates a system 700 for use in preparing films using sequential ion implantation, according to some embodiments. System 700 includes controller 710, stage 720, ion source 730, and database 740. Controller 710 is in operable communication with stage 720, ion source 730, and database 740. Controller 710 includes memory 750 for storing processing instructions, processor 760 for executing the stored processing instructions, display 770 for displaying data to a user, and input device 780 for accepting input from a user. Database 740 contains information on how to prepare a variety of different types of films using sequential ion implantation. Database 740 may be integral to controller 710, or may be remote to controller 710 and in operable communication with controller 710 via a network, such as the Internet. Stage 720 supports substrate 410, and is operable to adjust the position of the substrate in the x, y, and z directions responsive to instructions from controller 710, as well as to heat substrate 410 to a desired temperature. Ion source 730 emits ions of the first and second types at pre-selected energies and doses responsive to instructions from controller 710, each optionally in accordance with a pre-selected pattern, if such patterns are desired and a mask is not provided on the substrate.

Responsive to user input provided through input device 780, e.g., user input defining a desired type of film or structure to be prepared, controller 710 requests database 740 to provide information on how to prepare that type of film. Responsive to the request, database 740 provides some or all of the following information to the controller 710: the type of substrate to be used; any required preparation thereof; the first and second types of ion to be used; the energies, doses, and optional patterns with which the first and second type of ions respectively are to be implanted; the temperatures to which substrate 410 is to be heated during each implantation and processing step; and any additional processing to be performed after implanting the first and second types of ion. Controller 710 receives this information and stores it in memory 750. Processor 760 processes the stored information, and based on that information displays instructions to the user via display device 770 and controls stage 720 and ion source 730 to process the substrate 210 as appropriate.

In one example, the user uses input device 780, e.g., a keyboard and mouse, to input to the controller that he desires to prepare a diamond-like carbon film such as illustrated in FIG. 5C. Responsive to that input, controller 710 requests database 740 to provide information on preparing such a waveguide. Responsive to the request, database 740 provides a set of instructions to the controller 710, which controller 710 stores in memory 750. Processor 760 then processes the stored instructions to determine what information is to be displayed to the user via display device 770, and how the stage 720 and ion source 730 are to be controlled. For example, processor 760 determines, based on the stored instructions, that substrate 410 is to be an Si wafer, and that mask 420 (not illustrated in FIG. 7) is to be provided thereon. Processor 760 then causes this information to be displayed to the user via display device 770 so that the user may separately obtain the Si substrate and provide mask 420 thereon (step 320 in FIG. 3).

Next, the user places the prepared Si substrate 410 on stage 720, and uses input device 780 to inform controller 710 that the substrate is ready. Responsive to this input, processor 760 instructs stage 720 to move to a pre-determined position in the x, y, and z direction for ion implantation and to heat substrate 410 to a pre-determined temperature, based on the stored instructions. Processor 760 then instructs ion source 730 to implant the ions of the first type, such as O, at the dose and energy defined in the stored instructions (step 331 in FIG. 3). Then, depending on the further processing defined in the stored instructions (step 332 in FIG. 3), processor 760 may display instructions to the user 770 regarding any steps the user is to perform, such as providing a different mask (not required for preparing the film of FIG. 5C), and/or may control stage 720 to perform one or more steps as appropriate, such as annealing substrate 410 to form an embedded layer of $SiO_2$.

Processor 760 then instructs stage 720 to heat substrate 410 to a pre-determined temperature, and instructs ion source 730 to implant the ions of the second type, such as C, at the dose and energy defined in the stored instructions (step 340 in FIG. 3). Heating in this, and other heating/annealing steps described herein, may alternatively be accomplished in other ways. For example, a laser may be used to heat selected regions of the substrate by focusing the laser beam onto those regions of the substrate. Electron beams and ion beams may also be used to heat selected regions of the substrate.

Then, depending on the further processing defined in the stored instructions (step 350 in FIG. 3), processor 760 may display instructions to the user 770 regarding any steps the user is to perform, such as removing mask 420 on substrate 410 or removing substrate portion 411 or the $SiO_2$ layer, and/or may control stage 720 to perform one or more steps as appropriate, such as annealing substrate 410.

Those of skill in the art will appreciate that any of the user-performed steps may alternatively be automated using commercially available equipment (not illustrated). For example, instead of displaying to the user what type of substrate and mask is to be provided, controller 710 may instead be in operable communication with a robotic substrate handler that may obtain substrate 410 from a substrate store, and may process the substrate as required to provide the mask 420. In one embodiment, one or more steps of an instruction sequence are made contingent on a feedback parameter. For example, the characteristics of the substrate may change as different steps (e.g., heating, ion implantation, etching), and these changes may be automatically characterized, for example using spectroscopy. The system may include instructions to move to a different step in the process after a pre-determined change to the substrate is characterized.

Figure 8A:
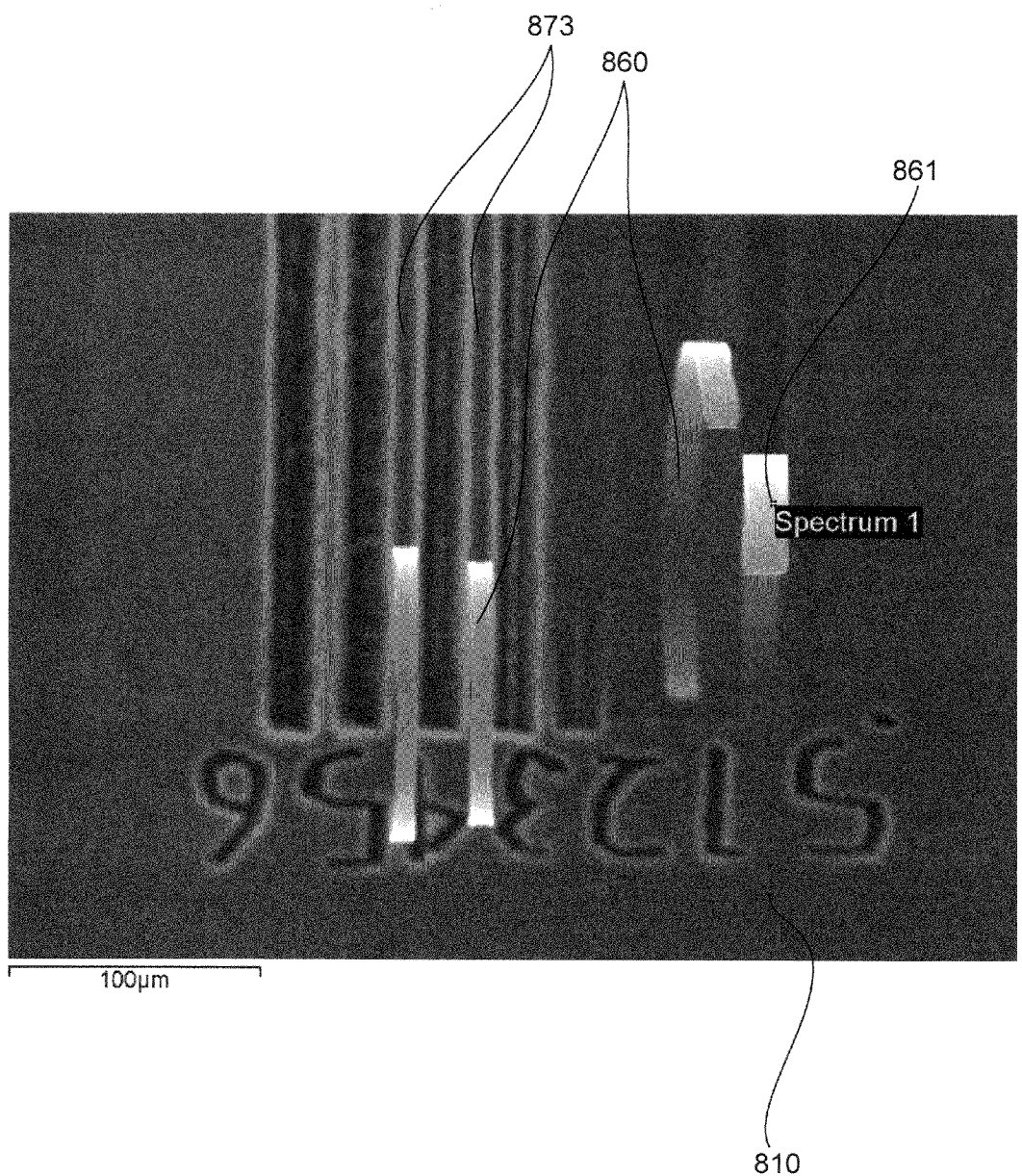
FIG. 8A is an image of a diamond-like carbon film prepared using sequential ion implantation, according to one example.
Figure 8B:
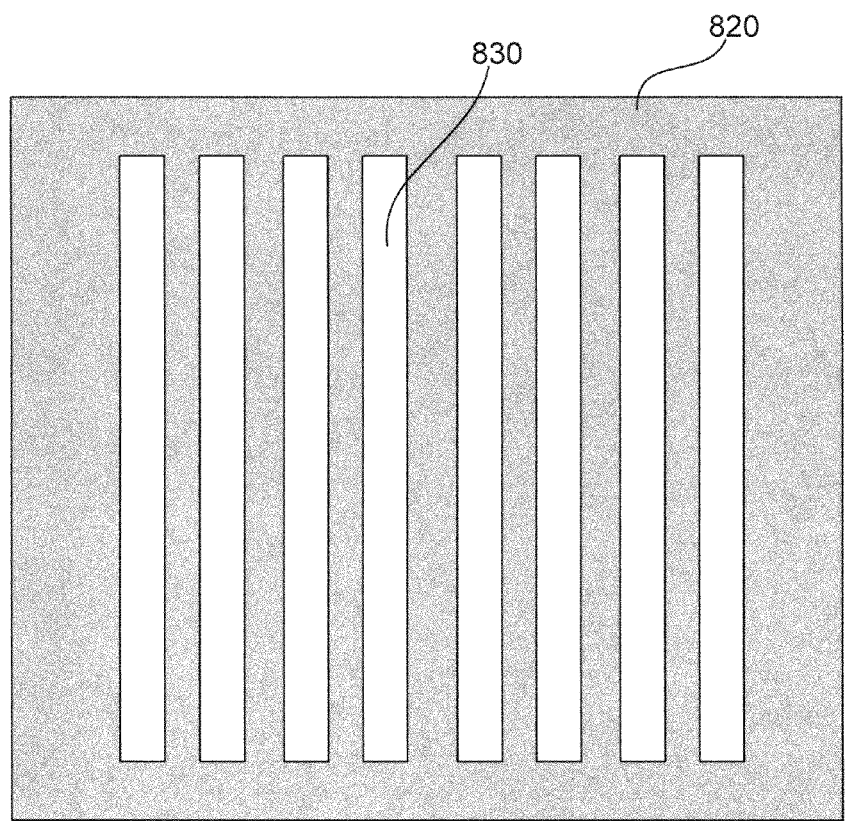
FIG. 8B illustrates a plan view of the mask used while forming the diamond-like carbon film of FIG. 8A.

FIG. 8A is a scanning electron microscope (SEM) image of an example of a diamond-like carbon film prepared using the method of FIG. 3. First, mask 420 was provided on the top surface of a single-crystal Si wafer 810, providing a structure such as illustrated in FIG. 4A (step 320 of FIG. 3). FIG. 8B is a schematic of the mask pattern 820 used, which included a series of elongated apertures 830 at a spacing of about 25 µm.

Next, Si wafer 810 was heated to a temperature of approximately 500° C., and O ions were implanted into a single-crystal Si wafer at a dose of about $2 \times 10^{17}/cm^2$ and an energy of about 75 keV (step 331 of FIG. 3). The result of this implantation step was a structure such as illustrated in FIG. 4B, having a layer of implanted O ions at a depth of about 2000 Angstroms and a density of approximately $6.8 \times 10^{16}/$ cm³. The Si wafer 810 was then annealed at a temperature approaching the melting point of silicon in a vacuum (step 332 of FIG. 3), causing the implanted O to form a buried $SiO_2$ structure such as illustrated in FIG. 4C.

Next, Si wafer 810 was heated to a temperature of approximately 500° C., and C ions were implanted at a dose of about $5\times10^{17}/cm^2$ (step 340 of FIG. 3). The result of this implantation step was a structure such as illustrated in FIG. 5A, having a layer of implanted C ions above and adjacent to the embedded $SiO_2$ structure. During the anneal, the C ions covalently bonded to each other, forming a diamond-like carbon layer over the $SiO_2$ structure, such as illustrated in FIG. 5B.

The portions of the substrate overlying the diamond-like carbon layers were then removed using the laser-assisted chemical etch methods described in U.S. Pat. No. 7,419,915, using gaseous chlorine as a chemical etchant and an argon-ion laser as a light source, providing a structure such as illustrated in FIG. 5C (step 350 of FIG. 3). A laser beam was then used to cut three of the edges of the exposed diamond-like carbon films, e.g., so that the films were only attached to the substrate at one end, as illustrated in FIG. 5D. Lastly, the underlying SiO2 layer was removed using a conventional 5% hydrofluoric (HF) acid etch, providing a structure such as illustrated in FIGS. 5E-5F. As can be seen in FIG. 8A, films 860, thus freed, curl up out of their respective cavities 873, and are smooth, high quality and continuous. The diamond-like carbon films 860 thus formed were characterized using transmission electron microscope (TEM) imaging and spectroscopy.

Figure 9A:
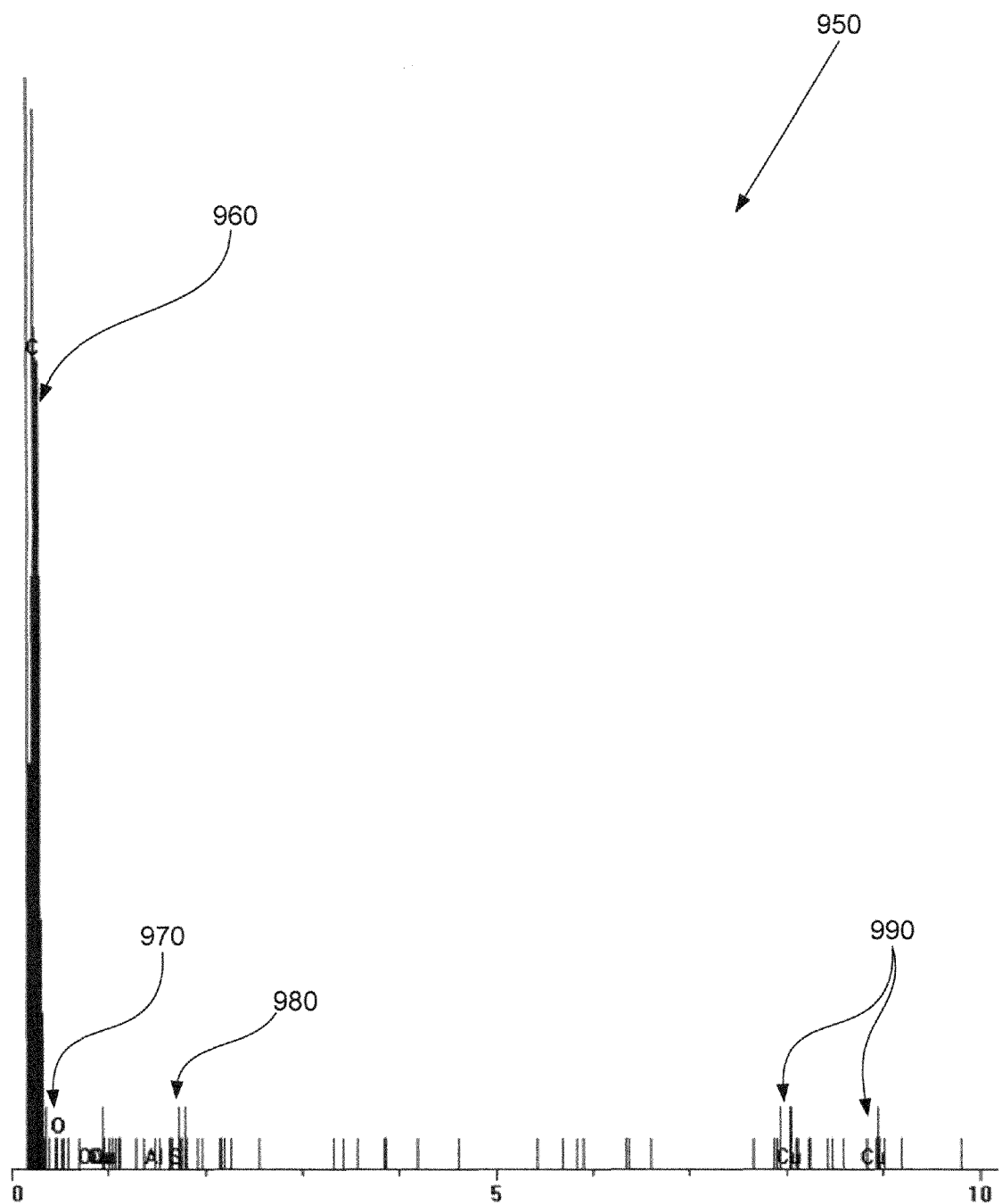
FIG. 9A is an energy dispersive X-ray (EDX) spectrum of the diamond-like carbon film of FIG. 8A.

FIG. 9A is an energy dispersive X-ray (EDX) spectrum 950 of diamond-like carbon film 860 of FIG. 8A, obtained at point 861. The EDX spectrum was obtained concurrently with the SEM image 810 of FIG. 8A. Specifically, the SEM microscope was used to excite the electrons of film 860 at point 861, ejecting some of the film's inner-shell electrons and creating holes. Electrons from higher-energy shells in the film then filled the holes, and the difference in energy between the higher- and lower-energy shells caused the release of X-rays. The number and energies of the X-rays thus released was captured by an energy dispersive spectrometer. Based on the energies of the captured X-rays, the elements of the film were deduced.

As shown in FIG. 9A, spectrum 950 includes two large peaks at 960, and numerous smaller peaks, including those at 970, 980, and 990. Based on the energies, it was determined that the peaks at 950 correspond to X-rays generated by C; the peaks at 960 correspond to X-rays generated by O; the peaks at 980 correspond to X-rays generated by Si, and the peaks at 990 correspond to Cu. Based on the relative magnitudes, it can readily be seen that the film is composed essentially of C, with trace amounts of O, Si, and Cu, among other elements.

Figure 9B:
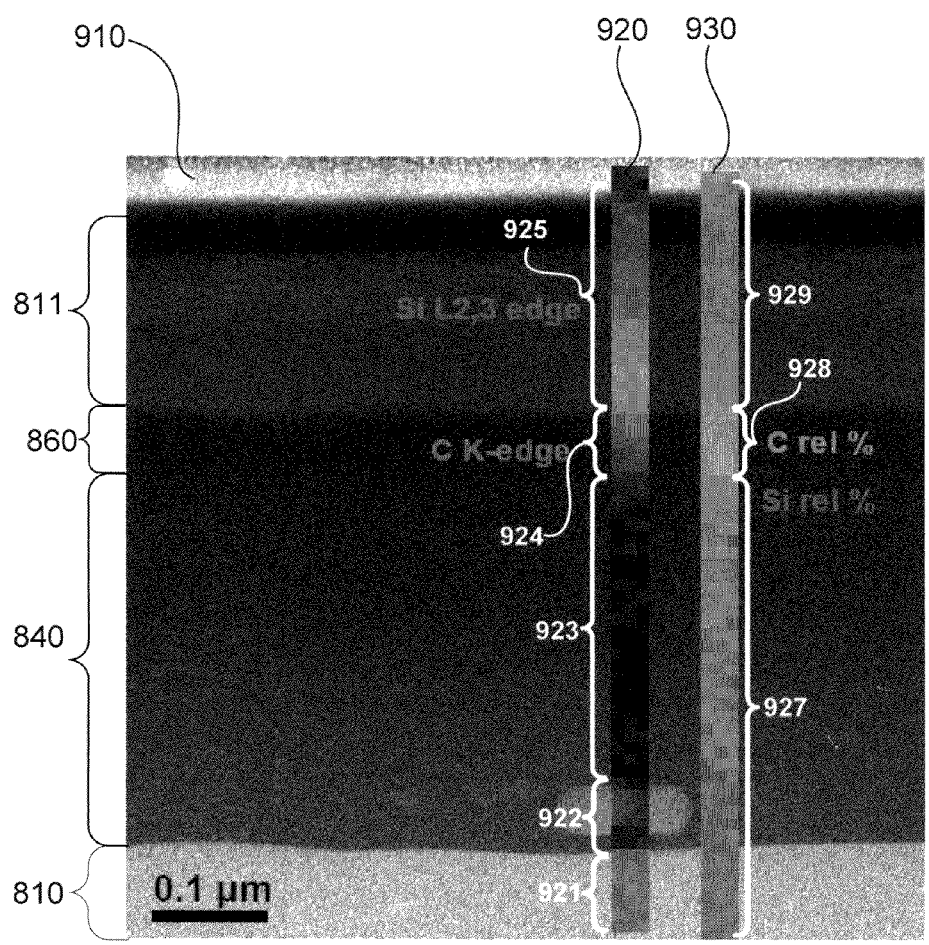
FIG. 9B includes a transmission electron microscopy (TEM) image and electron-loss spectra of the diamond-like carbon film of FIG. 8A.

FIG. 9B includes TEM image 910 of a cross-section of substrate 810, embedded $SiO_2$ structure 840, diamond-like carbon film 860, and portion 811 of the substrate overlying the diamond-like carbon film (i.e., substrate portion 811 and $SiO_2$ structure had not yet been removed). The cross-section was obtained using a focused ion beam (FIB) and had a thickness of about 50 nm. As can be seen in image 910, the sample includes several regions that are visually distinguishable from one another: substrate 810, embedded $SiO_2$ layer 840, and substrate region 811, which is darker than substrate region 810 because of damage caused by the implantations of C and O.

In FIG. 9B, diamond-like carbon layer 860 is not readily visually distinguishable. However, spectra 920 and 930 indicate the presence of a layer that consists primarily, or even essentially, of carbon. Spectra 920 and 930 were obtained by passing a 300 keV focused (~0.25 nm FWHM) electron beam through the sample. As the electrons passed through the thickness of the sample, some of them excite bound core electrons in the sample, and lose a corresponding amount of energy. As the focused electron beam is rastered across the sample, most of the transmitted electrons are captured by an energy loss spectrometer, and a spectrum is saved for each pixel to be mapped. In the instant analysis, the relative integrated intensities for electron energy loss spectral regions associated with the silicon L2,3 electronic transition and the carbon K electronic transition were analyzed. By analyzing the electronic losses in these spectral regions, the corrected integrated intensities for carbon and silicon were determined.

Spectrum 920 includes a mapping of the integrated spectral counts for the above-mentioned electronic transitions for Si and C. The counts indicate that region 921 contains the highest amount of Si, and essentially no C; that region 922 contains a somewhat lower amount of Si, but trace amounts of C; that region 923 contains a still lower amount of Si, and trace amounts of C; that region 924 contains the highest amount of C, and essentially no Si; and that region 925 contains Si in an amount somewhat lower than region 921. Based on the integrated spectral counts, represented in spectrum 920, the relative compositions of Si and C were calculated, and are represented in spectrum 930. The calculated relative compositions indicate that region 927 contains mainly Si, and trace amounts of C; that region 928 contains mainly C, and essentially no Si; and that region 929 contains mainly Si, and trace amounts of C. Because electron losses due to electronic transitions of O were not measured, spectra 920 and 930 do not contain information about the relative amount of O through the thickness of the sample. The lack of O contribution to the spectrum was not accounted for in the effect that it could have on the relative composition of Si and C. However, it is noted that region 923, which corresponds to $SiO_2$, likely appears darkened because it contains a relatively large amount of O, which reduced the amount of Si in that portion of the sample and thus the overall integrated count for that portion.

The integrated intensity of the C transition in region 924 of spectrum 920, and the relative composition in region 928 of spectrum 930, indicate that a film containing a high proportion of C, and essentially no Si, is sandwiched between upper and lower layers containing a high proportion of Si and only trace amounts of C. A visual comparison of TEM image 910 and the spectra 920, 930 further indicates that the upper layer 811 is primarily Si, that the lower layer 840 is primarily $SiO_2$, and that the film 860 containing the high proportion of C is interposed between the Si and $SiO_2$ interfaces. The formation of such film 860 was unexpected, because the implantation of C into Si is typically expected to form SiC. However, that spectral regions 924 and 927 contain essentially no Si indicates that SiC did not form. Thus, film 860 has significantly different characteristics than would have been expected using previously known ion implantation techniques.

Other modifications to the diffusion and/or reaction kinetics of subsequently implanted ions than those described herein may be used. Also, although most of the embodiments described herein utilize sequential implantation of two different types of ions, it is clear that three or more different types of ions can be sequentially implanted to prepare films having still further tailored properties, or to prepare multiple films, each having tailored properties.

Although various embodiments of the invention are described herein, it will be evident to one skilled in the art that various changes and modifications may be made without departing from the invention. It is intended in the appended claims to cover all such changes and modifications that fall within the true spirit and scope of the invention.

What is claimed is:

1. A structure prepared using ion implantation, the structure comprising:
    a substrate;
    a structure embedded within and substantially in the middle of the substrate and having pre-selected characteristics, there being an interface between the substrate and the embedded structure; and
    a substantially continuous film condensed solely at or immediately adjacent to the interface between the embedded structure and the substrate, the film comprising ions having a perturbed arrangement determined by the pre-selected characteristics of the embedded structure.

2. The structure of claim 1, wherein the perturbed arrangement comprises the ions being covalently bonded to each other or to the substrate.

3. The structure of claim 2, wherein the ions diffuse through the substrate in the absence of the embedded structure.

4. The structure of claim 3, wherein the embedded structure inhibits transport of the ions.

5. The structure of claim 1, wherein the embedded structure comprises $SiO_2$, the substrate comprises Si, and the ions comprise C.

6. The structure of claim 5, wherein the film comprises diamond-like carbon.

7. The structure of claim 5, wherein the film comprises graphene.

8. The structure of claim 5, wherein the film comprises SiC having a pre-selected phase.

9. The structure of claim 1, wherein the film provides a barrier layer within the substrate.

10. The structure of claim 1, wherein the film has a higher refractive index than the embedded structure, the film and the embedded structure providing a waveguide for transporting light laterally across the substrate, the embedded structure being a cladding layer at least partially surrounding the film.

11. The structure of claim 1, wherein the film is formed by implanting ions of a first type adjacent to the embedded structure and then annealing the substrate.

12. The structure of claim 11, wherein the embedded structure is formed by implanting ions of a second type into the substrate, the second type being different from the first type.

13. The structure of claim 1, wherein the film is formed by sequentially implanting at least two different types of ions into or adjacent to the embedded structure to form a complex species.

14. The structure of claim 1, wherein the substantially continuous film consists essentially of the ions.

15. A method for preparing a film using ion implantation, the method comprising:
    providing a substrate;
    embedding a structure within and substantially in the middle of the substrate, the structure having pre-selected characteristics, there being an interface between the substrate and the embedded structure; and
    implanting ions adjacent to the embedded structure to form a substantially continuous film condensed solely at or immediately adjacent to the interface between the embedded structure and the substrate, the film comprising the ions obtaining a perturbed arrangement determined by the pre-selected characteristics of the embedded structure.

16. The method of claim 15, wherein the ions obtaining the perturbed arrangement comprises the ions covalently bonding to one another or to the substrate.

17. The method of claim 16, wherein the ions diffuse through the substrate in the absence of the embedded structure.

18. The method of claim 17, wherein the embedded structure inhibits transport of the ions.

19. The method of claim 15, wherein embedding the structure comprises implanting ions of a type different from the ions that form the film.

20. The method of claim 15, further comprising removing a portion of the substrate overlying the film.

21. The method of claim 15, further comprising removing the embedded structure to at least partially free the film.

22. The structure of claim 14, wherein the ions are covalently bonded to one another.

* * * * *